US00RE45582E

(19) United States
(12) Reissued Patent
Kawashima

(10) Patent Number: US RE45,582 E
(45) Date of Reissued Patent: Jun. 23, 2015

(54) METHOD FOR MANUFACTURING A QUARTZ CRYSTAL UNIT

(71) Applicant: Piedek Technical Laboratory, Tokyo (JP)

(72) Inventor: Hirofumi Kawashima, Tokyo (JP)

(73) Assignee: PIEDEK TECHNICAL LABORATORY (JP)

(21) Appl. No.: 13/957,584

(22) Filed: Aug. 2, 2013

Related U.S. Patent Documents

Reissue of:
(64) Patent No.: 6,898,832
Issued: May 31, 2005
Appl. No.: 10/278,203
Filed: Oct. 22, 2002

U.S. Applications:
(62) Division of application No. 11/805,861, filed on May 24, 2007, now Pat. No. Re. 44,423, which is an application for the reissue of Pat. No. 6,898,832.

(30) Foreign Application Priority Data

Oct. 31, 2001 (JP) ..... 2001-334978
Mar. 6, 2002 (JP) ..... 2002-060827

(51) Int. Cl.
*H04R 17/00* (2006.01)
*H03H 3/02* (2006.01)
(Continued)

(52) U.S. Cl.
CPC ..... *H03H 9/1035* (2013.01); *H03H 9/1021* (2013.01); *H03H 9/105* (2013.01);
(Continued)

(58) Field of Classification Search
CPC ..... H03H 3/02; H03H 9/1014; H03H 9/1021; H03H 9/1035; H03H 9/105; H03H 9/215; H03H 2003/026; H03H 2003/0492; H03H 9/21; Y10T 29/49574; Y10T 29/49126; Y10T 29/49005; Y10T 29/42; Y10T 29/49004; Y10T 29/49128
USPC ..... 29/25.35, 593, 594, 830, 831, 896.22, 29/842; 310/319, 340, 344, 348, 361, 363, 310/370, 221; 216/79, 80, 59, 67
See application file for complete search history.

(56) References Cited

U.S. PATENT DOCUMENTS 3,683,213 A * 8/1972 Staudte ..... 310/348 X
4,099,078 A * 7/1978 Shibata et al. ..... 310/361
(Continued)

FOREIGN PATENT DOCUMENTS

JP 55000613 A * 1/1980 ..... 310/344
JP 56065517 6/1981
(Continued)

*Primary Examiner* — A. Dexter Tugbang
(74) *Attorney, Agent, or Firm* — Adams & Wilks

(57) ABSTRACT

In a method for manufacturing a quartz crystal unit, a quartz crystal tuning fork resonator is formed by etching a quartz crystal wafer to form a [quartz crystal] tuning fork base, [quartz crystal] tuning fork tines connected to the [quartz crystal] tuning fork base, and a groove having stepped portions in at least one of opposite main surfaces of each of the [quartz crystal] tuning fork tines[. A], *and by disposing a* first electrode [is disposed] on at least one of the stepped portions [of each of the grooves] and a second electrode [is disposed] on [each of side surfaces] *at least one side surface* of each of the [quartz crystal] tuning fork tines. [A frequency of oscillation of the quartz crystal tuning fork resonator is adjusted at least twice and in different steps. The quartz crystal tuning fork resonator is then mounted in a case and an open end of the case is covered with a lid.] *An overall length of the resonator and a length of the groove are determined so that a series resistance $R_1$ of a fundamental mode of vibration of the resonator is less than a series resistance $R_2$ of a second overtone mode of vibration thereof or less than a series resistance $R_3$ of a third overtone mode of vibration thereof.*

23 Claims, 26 Drawing Sheets

(51) Int. Cl.

| | |
|---|---|
| ***H03H 9/10*** | (2006.01) |
| ***H03H 9/21*** | (2006.01) |
| ***H03H 9/215*** | (2006.01) |
| *H03H 3/04* | (2006.01) |

(52) U.S. Cl.

CPC ..... *H03H 3/02* (2013.01); *H03H 9/1014* (2013.01); *H03H 9/21* (2013.01); *H03H 2003/0492* (2013.01); *H03H 9/215* (2013.01); *H03H 2003/026* (2013.01); *Y10T 29/49128* (2015.01); *Y10T 29/49004* (2015.01); *Y10T 29/49005* (2015.01); *Y10T 29/42* (2015.01); *Y10T 29/49574* (2015.01); *Y10T 29/49126* (2015.01)

(56) References Cited

U.S. PATENT DOCUMENTS

| | | | | | |
|---|---|---|---|---|---|
| 4,384,232 | A | * | 5/1983 | Debely | 310/370 |
| 4,437,773 | A | * | 3/1984 | Dinger et al. | 310/361 X |
| 4,652,787 | A | * | 3/1987 | Zingg | 310/344 |
| 5,334,900 | A | * | 8/1994 | Kawashima | 310/370 |
| 5,861,705 | A | * | 1/1999 | Wakatsuki et al. | 310/370 |
| 5,929,723 | A | * | 7/1999 | Kimura et al. | 310/363 X |

FOREIGN PATENT DOCUMENTS

| | | |
|---|---|---|
| JP | 00044092 | 7/2000 |
| JP | 00223992 | 8/2000 |

* cited by examiner

METHOD FOR MANUFACTURING A QUARTZ CRYSTAL UNIT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATIONS*

*This application is a reissue divisional of application Ser. No. 11/805,861, filed May 24, 2007, which is an application for reissue of U.S. Pat. No. 6,898,832, issued May 31, 2005, now U.S. Pat. No. Re. 44,423, issued Aug. 13, 2013.*

BACKGROUND OF THE INFORMATION

The present invention relates to a quartz crystal unit comprising a flexural mode, tuning fork, quartz crystal resonator, a case and a lid, and its manufacturing method.

BACKGROUND INFORMATION

Quartz crystal units with a tuning fork, quartz crystal resonator which vibrates in flexural mode are widely used as a time standard in consumer products, wearable equipment and communication equipment (such as wristwatches, cellular phones, and pagers). Recently, because of miniaturization and the light weight nature of these products, a smaller quartz crystal unit with a smaller flexural mode, tuning fork, quartz crystal resonator is required with a small series resistance and a high quality factor.

FIG. 28(a) and FIG. 28(b) show a plan view and a side view of a quartz crystal unit 101 with the conventional flexural mode, tuning fork, quartz crystal resonator 100. The resonator 100 comprises tuning fork tines 102, 103 and tuning fork base 104. The base 104 is fixed at a mounting portion 106 of a case 105 by adhesives 107, 108 or solder. Also, electrodes 109 and 110 are disposed on the mounting portion 106 and two electrode terminals are constructed. In addition, the case 105 and the lid 111 are connected via a metal 112. The conventional quartz crystal unit is constructed like this, and it is also needed to miniaturize a tuning fork, quartz crystal resonator to obtain a miniaturized quartz crystal unit with it.

It is, however, impossible to obtain a miniaturized quartz crystal unit with a conventional miniaturized, flexural mode, tuning fork, quartz crystal resonator with a small series resistance and a high quality factor. When miniaturized the conventional flexural mode, tuning fork, quartz crystal, resonator shown in FIG. 29 (which has electrodes on the obverse faces 203, 207, reverse faces 204, 208 and the four sides 205, 206, 209, 210 of each tuning fork tine, as also shown in FIG. 30—a cross-sectional view of tuning fork tines of FIG. 29), has a smaller electromechanical transformation efficiency, which provides a small electric field (i.e. Ex becomes small), a large series resistance, and a reduced quality factor. In FIG. 29, the conventional tuning fork resonator 113 is shown with tuning fork tines 114, 115 and tuning fork base 116.

In addition, it is impossible to obtain a flexural mode, tuning fork, quartz crystal resonator with a small frequency change over a wide temperature range of between −10° C. to +50° C. because the resonator has a temperature coefficient with a parabolic curve, and whose second order temperature coefficient is approximately $-3.5\times10^{-8}/°\ C.^2$. This value is comparatively large as compared with AT cut quartz crystal resonators vibrating in thickness shear mode.

Moreover, for example, Japanese Patent Nos. P56-65517 and P2000-223992A and International Patent No. WO 00/44092 teach grooves and electrodes constructed at tuning fork tines of a flexural mode, tuning fork, quartz crystal resonator. However, they teach nothing about a quartz crystal unit of the present invention having novel shape, novel electrode construction and an improvement of frequency temperature behaviour for a flexural mode, tuning fork, quartz crystal resonator, and also, teach nothing about a method of manufacturing a quartz crystal unit of the present invention.

It is, therefore, an object of the present invention to provide a quartz crystal unit with a flexural mode, tuning fork, quartz crystal resonator which overcomes the above-described problems and its manufacturing method.

SUMMARY OF THE INVENTION

The present invention relate to the shape and electrode construction of a flexural mode, tuning fork, quartz crystal resonator which is housed in a case, and in particular, a novel shape and electrode construction for a flexural mode, tuning fork, quartz crystal resonator available for consumer products and communication equipment requiring miniaturized, high accuracy, shock proof and low priced quartz crystal units.

It is an object of the present invention to provide a quartz crystal unit with a miniaturized flexural mode, tuning fork, quartz crystal resonator with a small series resistance $R_1$ and a high quality factor Q.

It is an another object of the present invention to provide a quartz crystal unit with a flexural mode, tuning fork, quartz crystal resonator with an excellent frequency temperature behaviour over a wide temperature range (of −10° C. to +50° C.).

It is a further object of the present invention to provide a method of manufacturing a quartz crystal unit.

According to one aspect of the present invention there is provided a quartz crystal unit with a tuning fork, quartz crystal resonator capable of vibrating in flexural mode comprising; tuning fork tines, a tuning fork base, said tuning fork tines having step difference portions and medium surface portions, with at least one first electrode on said step difference portions, with at least one second electrode disposed on the side of said tuning fork tines, and said at least one first and at least one second electrodes being of opposite electrical polarity.

According to a second aspect of the present invention there is provided a quartz crystal unit with a tuning fork, quartz crystal resonator capable of vibrating in flexural mode comprising; tuning fork lines, and a tuning fork base, a plurality of step difference portions provided at said tuning fork tines along the direction of length thereof, at least two of the plurality of step difference portions being connected via at least one step portion, first electrodes on the step difference portions, second electrodes disposed opposite to the first electrodes on the sides of said tuning fork tines, and said first and second electrodes being of opposite electrical polarity.

According to a third aspect of the present invention, there is provided a quartz crystal unit with a tuning fork, quartz crystal resonator capable of vibrating in flexural mode comprising; tuning fork tines, and a tuning fork base, at least one groove provided in the central line portion of each of said tuning fork tines, at least one first electrode provided inside each groove, at least one second electrode provided on the sides of said tuning fork tines, and for each tine said at least one second electrode having an opposite electrical polarity to said at least one first electrode.

According to a fourth aspect of the present invention there is provided a quartz crystal unit with a quartz crystal, tuning fork, resonator capable of vibrating in flexural mode comprising; tuning fork tines, tuning fork base, a plurality of grooves provided only on the tuning fork base where said base is coupled to the tuning fork tines, and electrodes provided in said grooves.

According to a fifth aspect of the present invention there is provided a quartz crystal unit with a resonator comprising; a plurality of individual flexural mode, tuning fork, quartz crystal resonators being connected and formed integrally at each tuning fork base via connecting portion wherein said individual quartz crystal resonators are coupled to each other at the respective tuning fork bases via the connecting portion and having an angle of separation of 0° to 30°.

According to a sixth aspect of the present invention there is provided a method for manufacturing a quartz crystal unit comprising: a flexural mode, tuning fork, quartz crystal resonator, a case of surface mounting type and a lid.

Embodiments of the present invention may provide a high electromechanical transformation efficiency.

Embodiments of the present invention use step differences or grooves and an electrode construction arranged on the tuning fork tines and/or tuning fork base of a flexural mode, tuning fork, quartz crystal resonator.

Preferably, the resonator has a step difference constructed at tuning fork tines and/or tuning fork base and electrodes disposed on the step difference portions.

Preferably, the resonator has grooves including the central line of the central portions for each tuning fork tine and the electrodes disposed inside the grooves and disposed on the sides of each tuning fork tine. Alternatively or additionally the grooves may be arranged on the tuning fork base and the electrodes disposed inside the grooves.

Preferably, at least two individual flexural mode, tuning fork, quartz crystal resonators connected and formed integrally at their respective tuning fork base via connecting portion may improve the frequency temperature behaviour. The quartz crystal resonators whose peak temperature points are different, may be connected electrically in parallel. As a result, the integrally formed quartz crystal resonator may have excellent frequency temperature behaviour over a wide temperature range of −10° C. to +50° C.

For a better understanding of the present invention, and as to how the same may be carried into effect, reference will now be made by way of example to the accompanying drawings.

DETAILED DESCRIPTION OF THE PREFERRED EMBODIMENTS

Figure 1A:
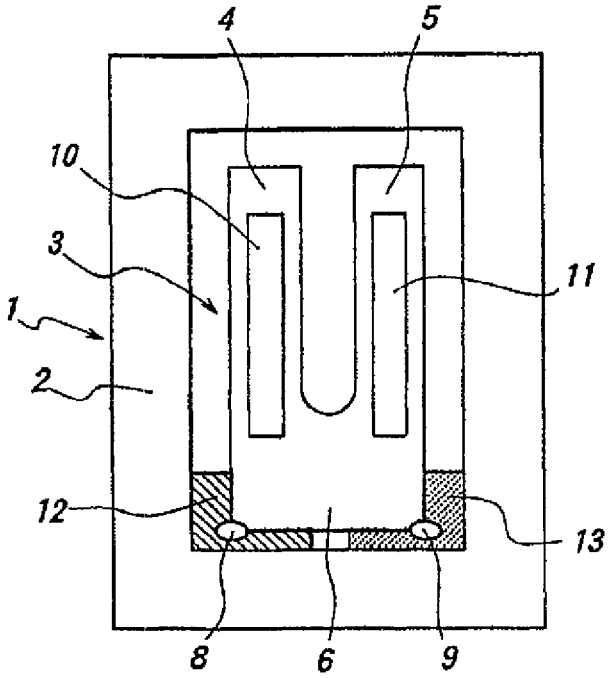
FIG. 1(a) and FIG. 1(b) show a plan view omitting a lid and a side view of a quartz crystal unit of the first embodiment of the present invention.

Referring now to the drawings, the embodiments of the present invention will be described in full detail.

Figure 1B:
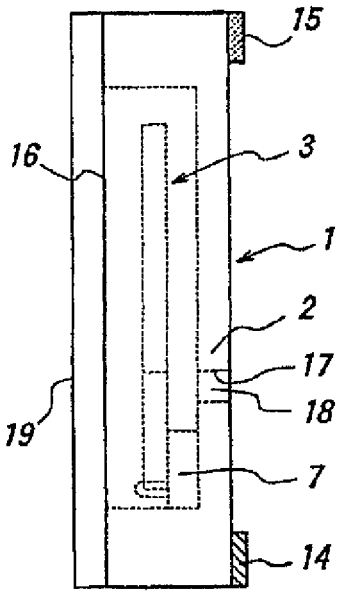

FIG. 1(a) and FIG. 1(b) show a plan view omitting a lid and a side view of a quartz crystal unit of the first embodiment of the present invention. The quartz crystal unit 1 comprises a case 2, a flexural mode, tuning fork, quartz crystal resonator 3 and a lid 19. Also, the resonator 3 comprises tuning fork tines 4, 5 and tuning fork base 6, and the base 6 is fixed on a mounting portion 7 constructed at the case 2 by conductive adhesives 8, 9 or solder. Additionally, grooves 10, 11 are constructed at the tines 4, 5 and the grooves extends into the base 6 in this embodiment. A flexural mode, tuning fork, quartz crystal resonator which is housed in a case of a quartz crystal unit of the present invention will be described in FIG. 2-FIG. 23 in detail.

Also, electrodes 12, 13 are disposed on the mounting portion 7 and connected to the respective electrodes with opposite electrical polarity disposed on the base 6, as a result of which two electrode terminals are constructed. In full detail, the electrode 12 extends into the reverse face of the case 2 and are connected to an electrode 14 constructed at one end portion thereof, while the electrode 13 also extends into the reverse face of the case 2 and connected to an electrode 15 constructed at other end portion thereof. The case 2 and lid 19 are connected via connecting member 16.

In this embodiment, though the electrodes 14 and 15 are constructed at both ends of the reverse face of the case 2, they may be constructed at an arbitrary location thereof. This electrode construction is also applied to embodiments which are described as follows.

In addition, the case 2 in this embodiment has a hole 17 to close it in vacuum and the hole 17 is closed by closing member 18. Also, ceramics or glass as a material of the case, glass or metal as a material of the lid, glass with the low melting point or metal including solder as a connecting member to connect the case and the lid and similarly, the glass with the low melting point or the metal as a closing member to close the hole are used respectively.

In this embodiment, though the case 2 has the hole 17 to close it in vacuum, the case 2 with no hole and the lid may be directly closed in vacuum via the connecting member. The construction of the case and the lid in this embodiment is also applied to that in another embodiments which are described as follows.

Figure 2:
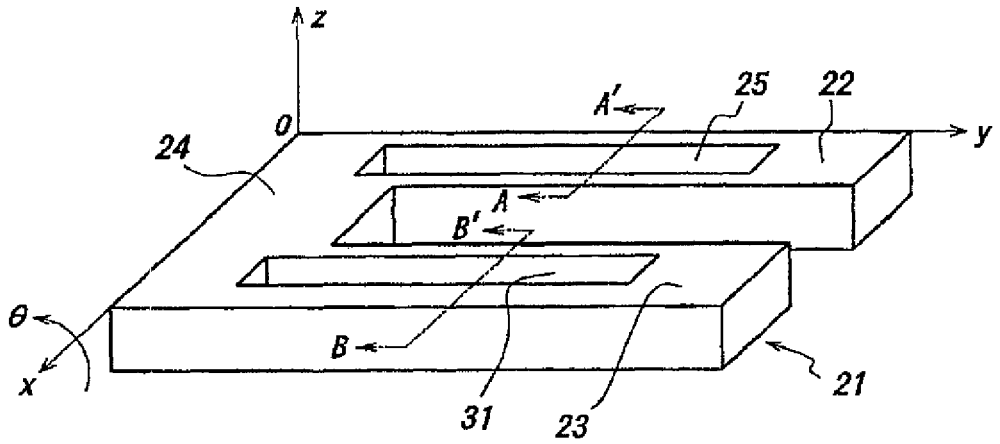
FIG. 2 is a general view of a flexural mode quartz crystal resonator of tuning fork type with grooves at each tuning fork tine constructing the quartz crystal unit of the present invention shown in FIG. 1(a) and FIG. 1(b) and its coordinate system.
Figure 3:
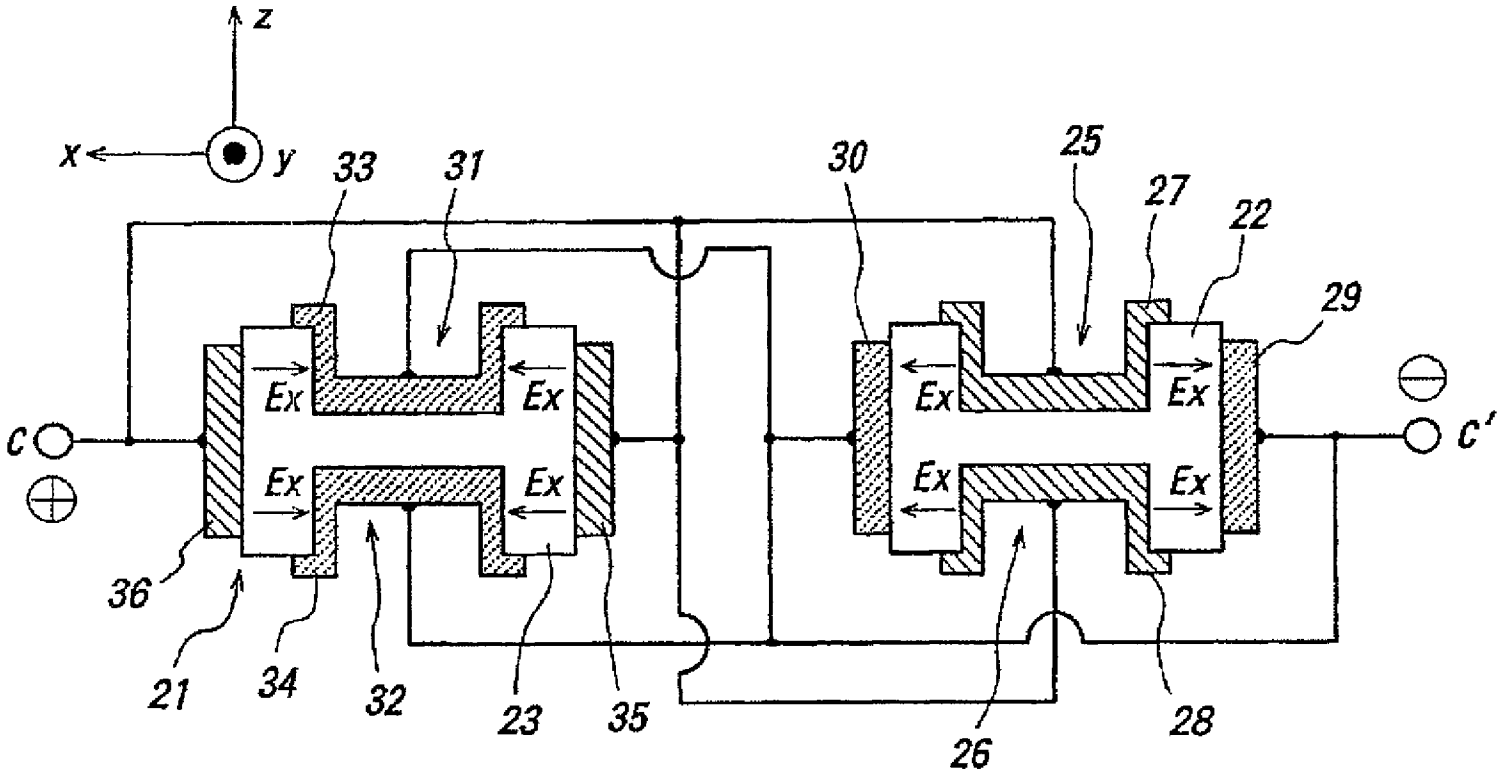
FIG. 3 is a A-A' and B-B' cross-sectional views of the tuning fork tines of FIG. 2 illustrating electrode construction.
Figure 4:
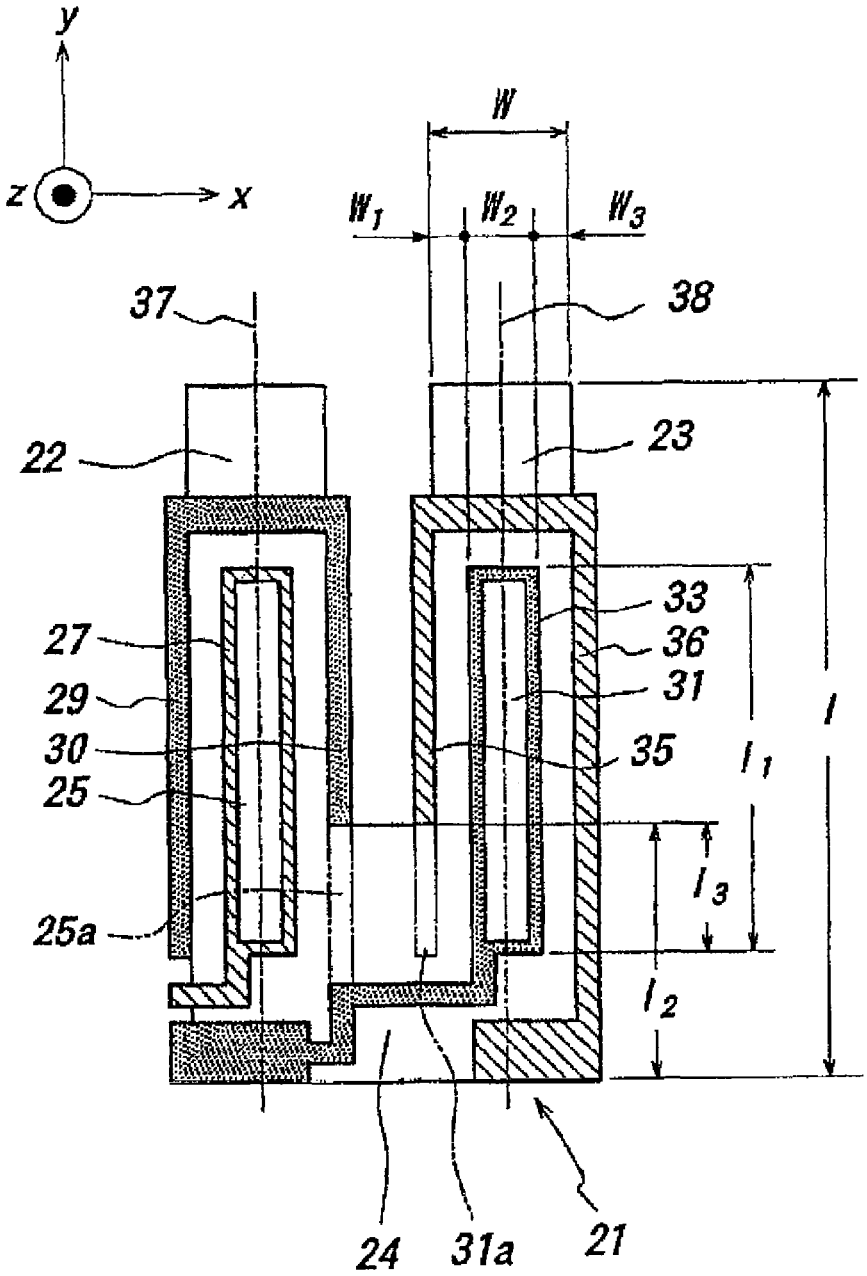
FIG. 4 is a plan view of the tuning fork, quartz crystal resonator of FIG. 2.

FIG. 2 shows a general view of a flexural mode, tuning fork, quartz crystal resonator housed in the case 2 of FIG. 1(a) and FIG. 1(b) embodying the present invention and its coordinate system. The coordinate system consists of an origin O, an electrical axis x, a mechanical axis y and an optical axis z of quartz, namely, O-xyz. A flexural mode, tuning fork, quartz crystal resonator 21 embodying the present invention comprises a first tuning fork tine 22, a second tuning fork tine 23 and a tuning fork base 24, the first tuning fork tine 22 and the second tuning fork tine 23 are connected at the tuning fork base 24. In addition, grooves 25 and 31 *each of which has a plurality of step difference portions, i.e., stepped portions including a first stepped portion, a second stepped portion and a third stepped portion connecting the first stepped portion to the second stepped portion as is shown in FIG. 3 and FIG. 4,* are constructed within the obverse [face] *faces* of tuning fork tines 22 and 23 which include a portion of the central line, respectively, as shown in FIG. [3,] *4, and* the same grooves are constructed within the reverse [face] *faces* of the tines 22 and 23. A cut angle θ, which has a typical value of 0° to 10°, is rotated from a Z-plate perpendicular to z axis about the x axis. Additionally, a groove is constructed at least with two step difference portions along the direction of length of tuning fork tines. In this embodiment, the groove is constructed with four step difference portions and has a rectangular shape in the plan view of FIG. 1.

FIG. 3 shows the A-A' and B-B' cross-sectional views of the tuning fork tines of FIG. 2 and electrode construction within the grooves. The A-A' cross-sectional view of the tuning fork tine 22 is shown on the right side and the B-B' cross-sectional view of the tuning fork tine 23 *is shown* on the left side. The tuning fork tine 22 has *a first side surface and a second side surface opposite the first side surface and* grooves 25 and 26 *each of which has a first stepped portion opposite the first side surface and a second stepped portion opposite the second side surface or a first surface opposite the first side surface and a second surface opposite the second side surface,* cut into it, which include a portion of central line of the tine 22. The grooves 25 and 26 have a first set of electrodes 27 and 28 of the same electrical polarity, while the [sides] *first and second side surfaces* of the tine 22 have a second set of electrodes 29 and 30 having an opposite electrical polarity to the first set of electrodes 27 and 28. The tuning fork tine 23 has *a first side surface and a second side surface opposite the first side surface and* grooves 31 and 32 *each of which has a first stepped portion opposite the first side surface and a second stepped portion opposite the second side surface or a first surface opposite the first side surface and a second surface opposite the second side surface,* constructed in a similar manner as tuning fork tine 22. The grooves 31 and 32 have a third set of electrodes 33 and 34 of the same electrical polarity, and the [sides] *first and second side surfaces* of the tine 23 have a fourth set of electrodes 35 and 36 with the opposite electrical polarity to the third electrodes 33 and 34. The electrodes disposed on the tuning fork tines 22 and 23 are connected as shown in FIG. 3, namely, two electrode terminals of different polarity C-C' are obtained.

In detail, the first set of electrodes 27 and 28 disposed on *surfaces of* the grooves 25 and 26 of the tuning fork tine 22 have the same electrical polarity as the fourth set of electrodes 35 and 36 disposed on [both sides] *the first and second side surfaces* of the tuning fork tine 23, while the second set of electrodes 29 and 30 disposed on [both sides] *the first and second side surfaces* of the tuning fork tine 22 have the same electrical polarity as the third set of electrodes 33 and 34 disposed on the grooves 31 and 32 of the tine 23. Now, when a direct voltage is applied between the electrode terminals C-C', an electric field Ex occurs along the arrow direction inside the tuning fork tines 22 and 23. As the electric field Ex occurs perpendicular to the electrodes disposed on the tuning fork tines, as shown in the arrow signs, the electric field Ex has a very large value and a large distortion occurs at the tuning fork tines. As a result, a tuning fork, quartz crystal resonator is obtained with a small series resistance $R_1$ and a high quality factor Q because even when miniaturized there is a large electromechanical transformation efficiency for the resonator. *Thus, each of the tuning fork tines 22, 23 has a first main surface and a second main surface opposite the first main surface, and a first side surface and a second side surface opposite the first side surface, and the grooves 25, 26 are formed in the first and second main surfaces of the tuning*

*fork tine 22 and the grooves 31, 32 are formed in the first and second main surfaces of the tuning fork tine 23. In addition, a first electrode is disposed on a surface of each of the grooves 25, 26, 31 and 32 formed in the first and second main surfaces of each of the tuning fork tines 22, 23 and a second electrode is disposed on each of the first and second side surfaces of each of the tuning fork tines 22, 23 so that the first electrodes 27, 28 disposed on the surfaces of the grooves 25, 26 formed in the first and second main surfaces of the tuning fork tine 22 are connected to the second electrodes 35, 36 disposed on the first and second side surfaces of the tuning fork tine 23, and the first electrodes 33, 34 disposed on the surfaces of the grooves 31, 32 formed in the first and second main surfaces of the tuning fork tine 23 are connected to the second electrodes 29, 30 disposed on the first and second side surfaces of the tuning fork tine 22.*

FIG. 4 shows a plan view of [a] *the* tuning [fork,] *fork* quartz crystal resonator 21 of FIG. 2. In FIG. 4, the construction and the dimension of grooves 25 and 31 are described in detail. The groove 25 is constructed to include a portion of the central line 37 of the tuning fork tine 22, *and* the groove 31 is similarly constructed to include a portion of the central line 38 of the tuning fork tine 23. The width $W_2$ of the grooves 25 and 31 which include a portion of the central lines 37 and 38, respectively, is preferable because the tuning fork tines 22 and 23 can vibrate in *a* flexural mode easily.

In other words, [a] *the* flexural mode, tuning fork, quartz crystal resonator can be obtained with a small series resistance $R_1$ and a high quality factor Q. The total width W of the tuning fork tines 22 and 23 has a relationship of $W=W_1+W_2+W_3$, and in general at least one of the *four* grooves *25, 26, 31 and 32* is constructed so that $W_1 \geq W_3$. *Namely, each of the four grooves 25, 26, 31 and 32 has the first stepped portion opposite the first side surface of the tuning fork tine and the second stepped portion opposite the second side surface of the tuning fork tine as described in FIG. 3, and when a distance in the width direction of the groove measured from a first outer edge of the first stepped portion of the groove to a first outer edge of the corresponding one of the quartz crystal tuning fork tines 22, 23 is defined by $W_1$ and a distance in the width direction of the groove measured from a second outer edge of the second stepped portion of the groove to a second outer edge of the corresponding one of the quartz crystal tuning fork tines 22, 23 is defined by $W_3$, the groove is formed in at least one of the first and second main surfaces of each of the tuning fork tines 22, 23 so that $W_1$ is greater than $W_3$.* In addition, the width $W_2$ of the grooves is constructed so that $W_2 \geq W_1$, $W_3$. Also, a ratio ($W_2$/W) of the groove width $W_2$ and the total width W is in a range of 0.35 to 0.85 because *a* moment of inertia of *each of* the tuning fork tines becomes very large by the ratio. That is to say, [a] *the* flexural mode, tuning fork, quartz crystal resonator can be provided with a small series resistance $R_1$, a quality factor Q and a small capacitance ratio because electromechanical transformation efficiency becomes large markedly.

Likewise, the length $l_1$ of the grooves 25 and 31 of tuning fork tines 22 and 23 extends into the tuning fork base 24 (which has a dimension of the length $l_2$ and the length $l_3$ of the grooves). Furthermore, the total length l is determined by the frequency requirement and the size of the housing case. At the same time, to get a flexural mode, tuning fork, quartz crystal resonator capable of vibrating easily in fundamental mode with suppression of the second and third overtone modes which are unwanted vibration modes, there is a close relationship between groove length $l_1$ and the total length l. Namely, a ratio ($l_1$/l) of the groove length $l_1$ and the total length l is in a range of 0.2 to 0.78 because the quantity of charges which generate within the grooves and on the sides of the tuning fork tines and/or the tuning fork base can be controlled by the ratio and the second and third overtone modes which are unwanted vibration modes can be suppressed substantially. In order to achieve the above mentioned object, it may be satisfied with at least one groove with the ratio constructed at the tines. As a result of which the flexural mode, tuning fork, quartz crystal resonator capable of vibrating easily in fundamental mode can be realized.

In more detail, series resistance $R_1$ of the quartz crystal resonator capable of vibrating in fundamental mode becomes smaller than series resistances $R_2$ and $R_3$ of the second and third overtone modes. Namely, $R_1<R_2$, $R_3$, therefore, an oscillator comprising an amplifier (CMOS inverter), capacitors, resistors (resistance elements) and a quartz crystal unit with the tuning fork quartz crystal resonator of this embodiment can be obtained, which is capable of vibrating in fundamental mode very easily. In addition, in this embodiment the grooves 25 and 31 of tuning fork tines 22 and 23 extend into the tuning fork base 24 in series, but embodiment of the present invention includes a plurality of grooves divided in the length direction of the tuning fork tines.

In summary the embodiments shown within FIG. 1 to FIG. 4, the tuning fork tines have four grooves within the obverse and the reverse faces thereof and electrodes provided inside the grooves as well as electrodes disposed on both sides of the tuning fork tines. The embodiments of the present invention, however, may have at least one groove within at least at one surface of the tuning fork tines and an electrode inside the at least one groove as well as electrodes disposed on both sides of the tuning fork tine. Also, it is provided that the first electrode inside the groove and the second electrodes on said side of the tine next to said electrode are of opposite electrical polarity.

In addition, though the electrodes are disposed within the grooves and on the side faces of the tuning fork base in this embodiment, the present invention is not limited to this, but includes at least one electrode which is of opposite electrical polarity to the electrodes of adjoining grooves between the grooves of the tuning fork base, disposed on each of the obverse and reverse faces thereof. For example, two electrodes 25a and 31a illustrated by virtual lines in FIG. 4, or four electrodes (*corresponding to a fourth electrode, a fifth electrode, a sixth electrode and a seventh electrode*) where the electrodes disposed opposite each other in the thickness direction are of the same electrical polarity.

Figure 5:
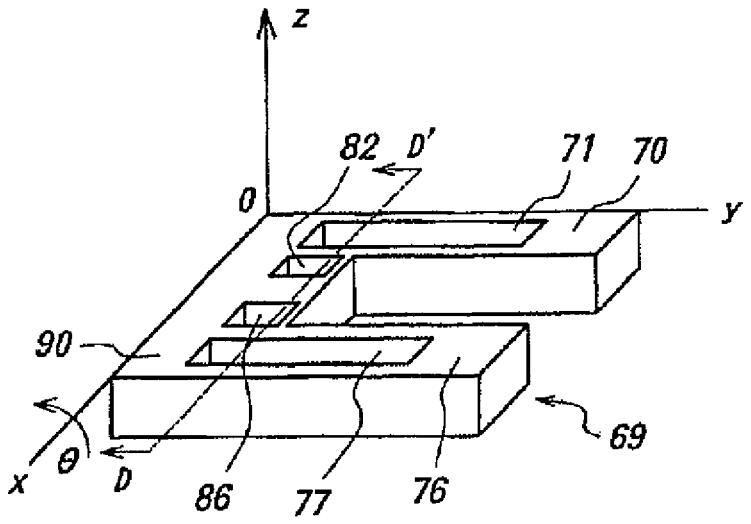
FIG. 5 is a general view of a flexural mode, tuning fork, quartz crystal resonator constructing a quartz crystal unit of the second embodiment of the present invention, and having plural grooves at the tuning fork base.

FIG. 5 shows a general view of a flexural mode, tuning fork, quartz crystal resonator 69 which constructs a quartz crystal unit of the second embodiment of the present invention and its coordinate system O-xyz. A cut angle θ, which has a typical value of 0° to 10°, is rotated from a Z-plate perpendicular to the z axix about the x axis. The flexural mode, tuning fork, quartz crystal resonator 69 comprises two tuning fork tines 70 and 76 and tuning fork base 90. The tuning fork tines 70 and 76 have grooves 71 and 77 respectively, with the grooves 71 and 77 extending into the tuning fork base 90. In addition, the tuning fork base 90 has the additional grooves 82 and 86.

Figure 6:
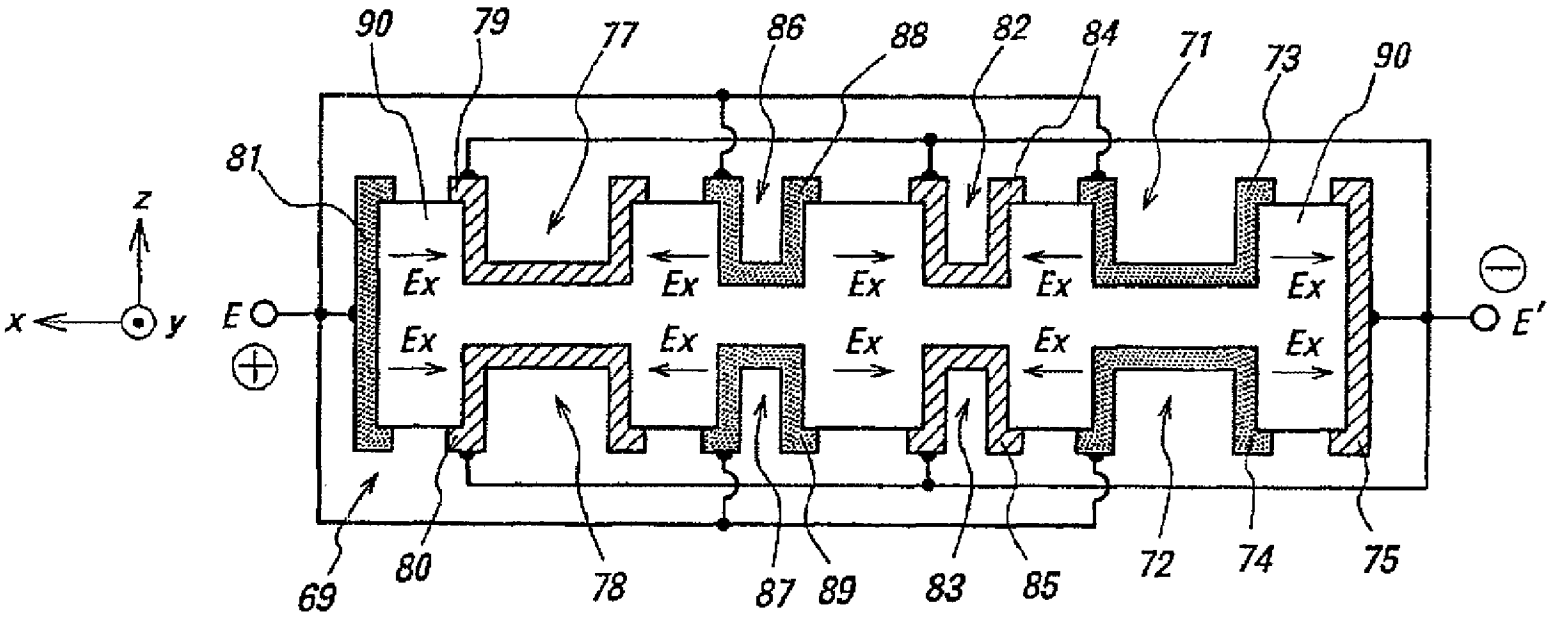
FIG. 6 is a D-D' cross-sectional view of the tuning fork base of FIG. 5 and illustrating electrode construction.

FIG. 6 shows a D-D' cross-sectional view of the tuning fork base 90 for the flexural mode, tuning fork, quartz crystal resonator 69 of FIG. 5. In FIG. 6, the shape of the electrode construction within the tuning fork base 90 for the quartz crystal resonator of FIG. 5 is described in detail. The section of the tuning fork base 90 which couples to the tuning fork tine 70 has the grooves 71 and 72 cut into the obverse and the reverse faces of the base 90. Also, the section of the tuning fork base 90 which couples to the tuning fork tine 76 has the grooves 77 and 78 cut into the obverse and the reverse faces of the base 90. In addition to these grooves, the tuning fork base 90 has the grooves 82 and 86 cut between the grooves 71 and 77, and also, the base 90 has the grooves 83 and 87 cut between the grooves 72 and 78.

Furthermore, the grooves 71 and 72 have the first electrodes 73 and 74 both of the same electrical polarity, the grooves 82 and 83 have the second electrodes 84 and 85 both of the same electrical polarity, the grooves 86 and 87 have the third electrodes 88 and 89 both of the same electrical polarity, the grooves 77 and 78 have the fourth electrodes 79 and 80 both of same electrical polarity and the sides of the base 90 have the fifth and sixth electrodes 75 and 81, each of opposite electrical polarity. In more detail, the fifth, fourth, and second electrodes 75, 79, 80, 84 and 85 have the same electrical polarity, while the first, sixth and third electrodes 73, 74, 81, 88 and 89 have the opposite electrical polarity to the others. Two electrode terminals E-E' are constructed. That is, the electrodes disposed inside the grooves constructed opposite each other in the thickness (z axis) direction have the same electrical polarity. Also, the electrodes disposed opposite each other across adjoining grooves have opposite electrical polarity.

Now, when a direct voltage is applied between the electrode terminals E-E' (E terminal: plus, E' terminal: minus), an electric field Ex occurs in the arrow direction as shown in FIG. 6. As the electric field Ex occurs perpendicular to the electrodes disposed on the tuning fork base, the electric field Ex has a very large value and a large distortion occurs at the tuning fork base, so that a flexural mode, tuning fork, quartz crystal resonator is obtained with a small series resistance $R_1$ and a high quality factor Q, even if it is miniaturized.

Figure 7:
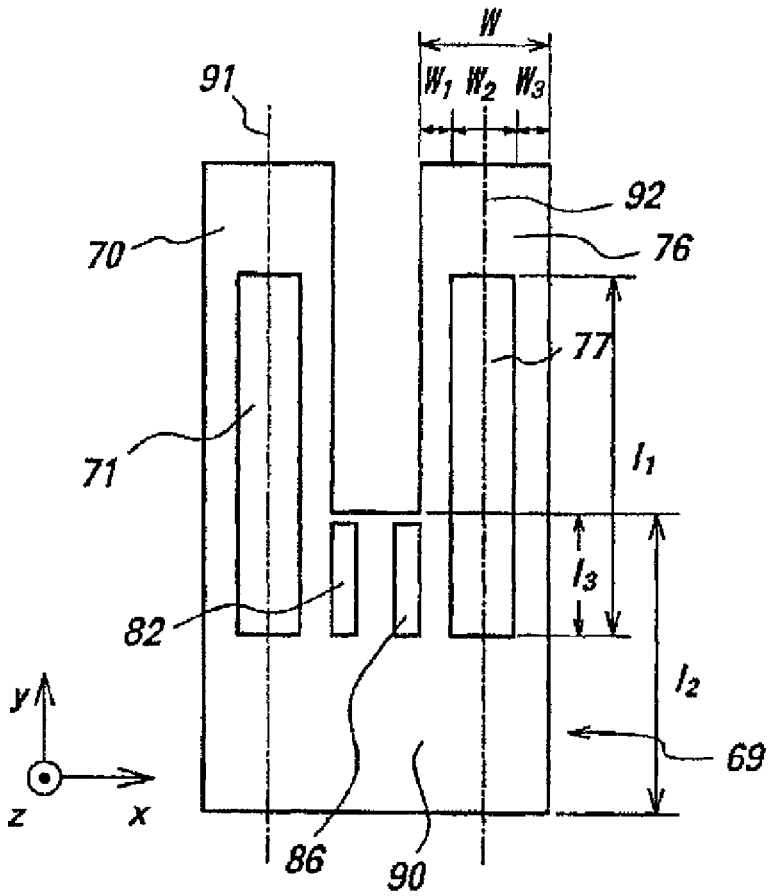
FIG. 7 is a plan view of the flexural mode quartz crystal resonator of FIG. 5.

FIG. 7 shows a plan view of the tuning fork, quartz crystal resonator 69 of FIG. 5. In FIG. 7, the disposition of the grooves 71 and 77 is particularly described in detail. The tuning fork tine 70 has the groove 71 cut including a portion of the central line 91 of the tine, as well, the tuning fork tine 76 has also the groove 77 cut including a portion of the central line 92 of the tine. In addition, a flexural mode, tuning fork, quartz crystal resonator embodying the present invention has grooves 82 and 86 between the grooves 71 and 77 constructed at the tuning fork base 90 and the tuning fork tines 70 and 76.

Thus, a flexural mode, tuning fork, quartz crystal resonator with the shape and the electrode construction embodying the present invention has excellent electrical characteristics, even if it is miniaturized. Namely, the quartz crystal resonator has a small series resistance $R_1$ and a high quality factor Q. The width dimension $W=W_1+W_2+W_3$, and length dimensions $l_1$, $l_2$ and $l_3$ are as already described in relation to FIG. 4.

Figure 8:
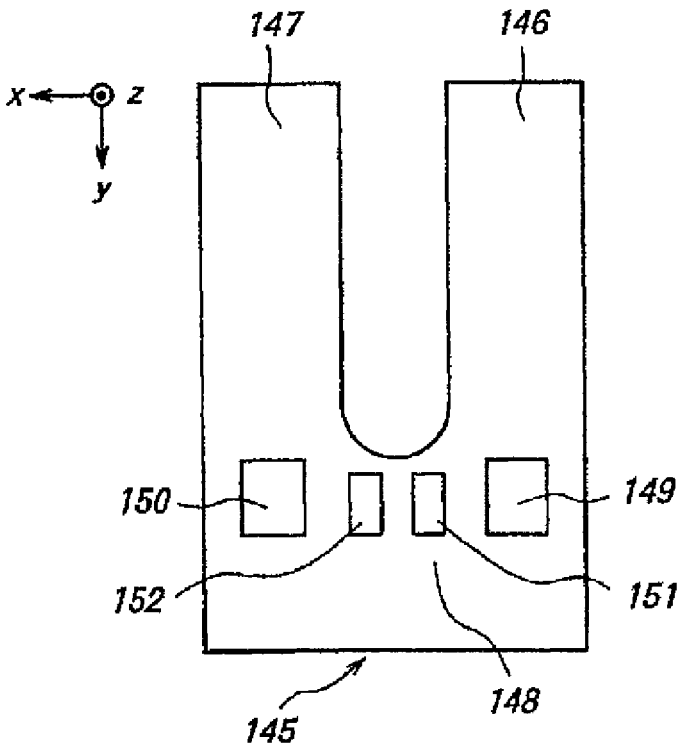
FIG. 8 is a plan view of a flexural mode, tuning fork, quartz crystal resonator constructing a quartz crystal unit of the third embodiment of the present invention.

FIG. 8 shows a plan view of a flexural mode, tuning fork, quartz crystal resonator 145 which constructs a quartz crystal unit of the third embodiment of the present invention. The flexural mode, tuning fork, quartz crystal resonator 145 comprises tuning fork tines 146, 147 and tuning fork base 148. At least one end of the tuning fork tines 146 and 147 connected to the tuning fork base 148. In this embodiment, a plurality of grooves 149, 150, 151 and 152 are constructed only within the tuning fork base 148. Additionally, a plurality of grooves is similarly constructed within the reverse face of tuning fork base 148.

In addition, the grooves 149 and 150 are constructed within the tuning fork base 148 where at least one end of the tuning fork tines 146 and 147 is connected to the tuning fork base 148. Furthermore, the grooves 151 and 152 are constructed between the grooves 149 and 150. The electrode disposition and the construction is not shown, but is similar to that already explained in detail in FIG. 6. Thus, by constructing the grooves and the electrodes, a flexural mode, tuning fork, quartz crystal resonator is obtained with a small series resistance R1 and a high quality factor Q because a large distortion occurs at the tuning fork base.

Figure 9:
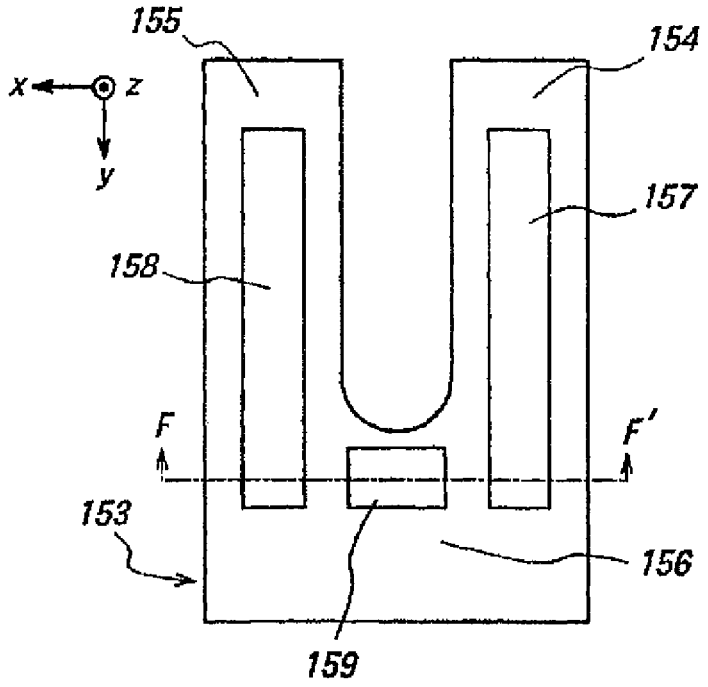
FIG. 9 is a plan view of a flexural mode, tuning fork, quartz crystal resonator constructing a quartz crystal unit of the fourth embodiment of the present invention.

FIG. 9 shows a plan view of a flexural mode, tuning fork, quartz crystal resonator 153 which constructs a quartz crystal unit of the fourth embodiment of the present invention. The quartz crystal resonator of tuning fork type 153 comprises the tuning fork tines 154, 155 and the tuning fork base 156. The tuning fork tines 154 and 155 have grooves 157 and 158 which extend to the tuning fork base 156. In addition, a groove 159 constructed between the grooves 157 and 158 and constructed within the tuning fork base 156.

Figure 10:
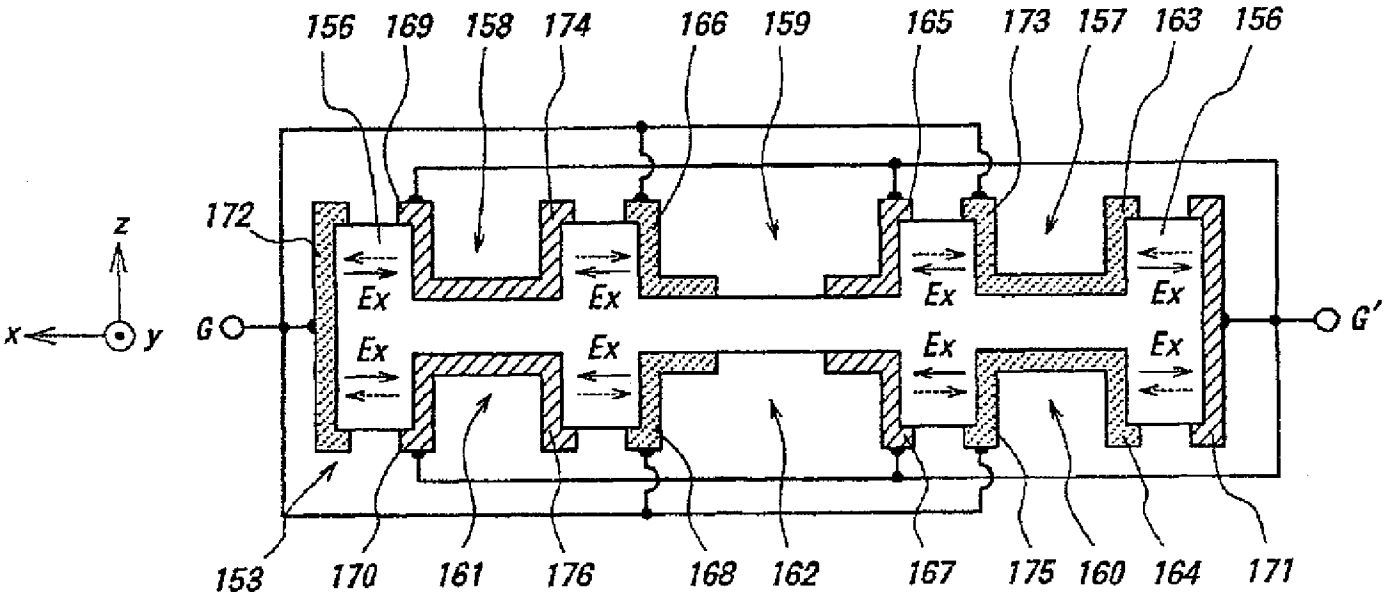
FIG. 10 is a F-F' cross-sectional view of the tuning fork base of FIG. 9 and illustrating electrode construction.

FIG. 10 shows F-F' cross-sectional view of the tuning fork base 156 for the flexural mode quartz crystal resonator 153 of FIG. 9. Here, the shape and the electrode construction of the cross-sectional view of the tuning fork base 156 for the quartz crystal resonator 153 in FIG. 9 are described in detail. As shown in FIG. 10, the quartz crystal resonator 153 has grooves 157 and 160 within the obverse and the reverse faces of the tuning fork base 156 where it connects to the tuning fork tine 154. The groove 157 is constructed opposite the groove 160. Similarly, the resonator 153 has grooves 158 and 161 within the obverse and the reverse faces of the tuning fork base 156 where it connects to the tuning fork tine 155. The groove 158 is constructed opposite groove 161. In addition, the groove 159 is constructed between the groove 157 and the groove 158, and the groove 162 constructed opposite groove 159 is constructed between the groove 160 and groove 161.

Furthermore, the grooves 157, 160 have the electrodes 163, 164 of the same electrical polarity, the grooves 159, 162 have the electrodes 165, 166 and the electrodes 167, 168, the grooves 158, 161 have the electrodes 169, 170 of the same electrical polarity, and both sides of the tuning fork base 156 have the electrodes 171, 172 of opposite electrical polarities. The electrodes are connected in such a way that electrodes disposed opposite the sides of the grooves 157, 158, 159, 160, 161, 162 have different electrical polarities. Thus, the electrodes 165, 167, 169, 170, 171 are all the same electrical polarity while the electrodes 163, 164, 166, 168, 172 are the opposite electrical polarity. As a result, the embodiment of the present resonator has two electrode terminals G-G'.

Therefore, the groove 159 has the electrode 165 and the electrode 166 each of opposite electrical polarity, similarly, the groove 162 has the electrode 167 and the electrode 168 each of opposite electrical polarity. The electrodes disposed opposite the electrodes disposed on the sides of the adjoining grooves in the x-axis direction are of opposite electrical polarity. That is, in this embodiment, the electrode 173 disposed on the side of the grooves 157 opposite to the electrode 165 disposed on the side of the groove 159 are of opposite electrical polarities, similarly, the electrodes 175 and 167 are of opposite electrical polarities, the electrodes 166 and 174 are also of opposite electrical polarities, and the electrodes 168 and 176 are of opposite electrical polarities. In addition, the electrode 163 and the electrode 164 disposed inside the grooves 157 and 160 constructed opposite in the thickness (z-axis) direction are the same electrical polarity. Likewise, the electrode 169 and the electrode 170 disposed inside the grooves 158 and 161 constructed opposite in the thickness (z-axis) direction are also the same electrical polarity. The electrodes 163, 164, 169, 170 disposed inside the grooves 157, 160, 158, 161 and the electrodes 171, 172 disposed on the sides of the tuning fork base 156 extend from the tuning fork base 156 to the tuning fork tines 154, 155.

Now, when an alternating voltage is applied between two electrode terminals G-G', an electric field $E_X$ occurs alternately along the arrow directions shown by the solid and broken lines. As a result, a flexural mode is generated in the inverse phase. In addition, as the is electric field $E_X$ occurs perpendicular to the electrodes between the electrodes disposed on the sides of the grooves, the electric field $E_X$ becomes large, and as the tuning fork base 156 also has grooves 159, 162 and electrodes 165, 166, 167, 168, a markedly large distortion occurs at the tuning fork base, so that a flexural mode, tuning fork, quartz crystal resonator is obtained with a small series resistance $R_1$ and a high quality factor Q when it is miniaturized. In the above-mentioned embodiments the grooves are constructed on the tuning fork tines and/or the tuning fork base, but embodiment of the present invention includes holes instead of the grooves or a combination of the grooves and the holes. In addition, two electrode terminals implies two electrodes which are of opposite electrical polarity and also includes electrodes divided into more than three two of which are of opposite electrical polarity.

Figure 11:
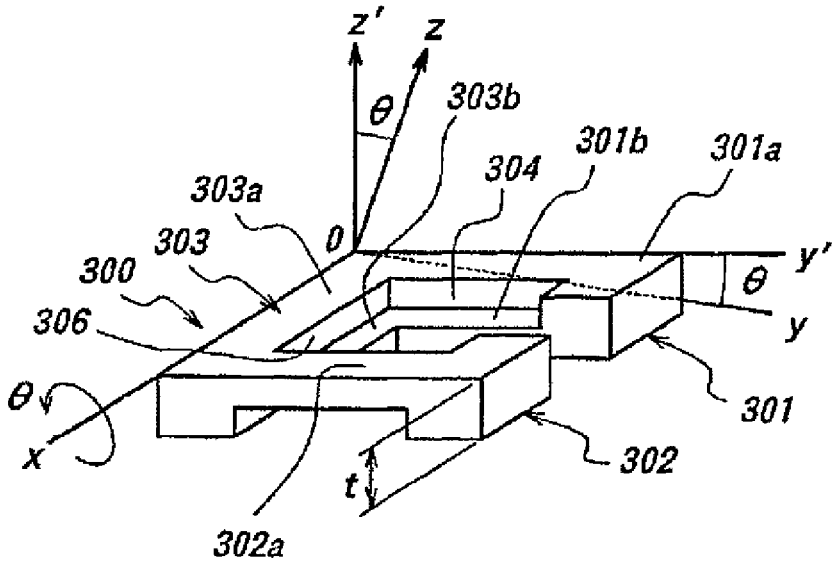
FIG. 11 is a general view of a flexural mode, tuning fork, quartz crystal resonator constructing a quartz crystal unit of the fifth embodiment of the present invention and its coordinate system.
Figure 12:
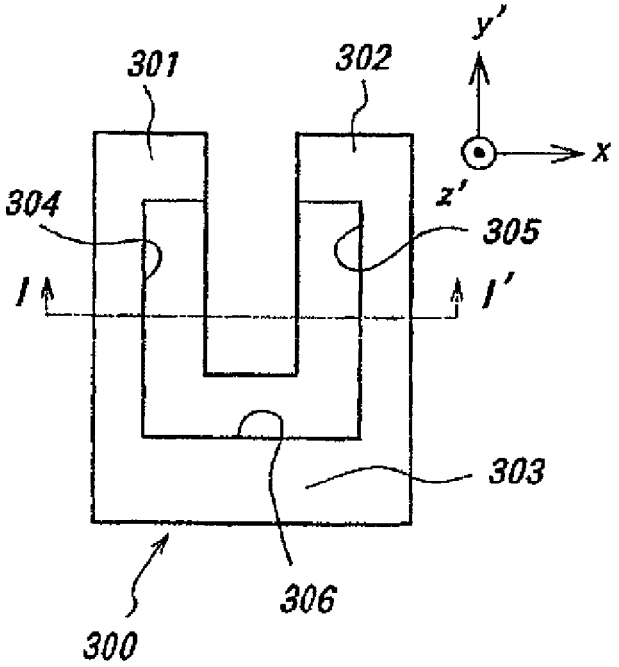
FIG. 12 is a plan view of the flexural mode quartz crystal resonator of FIG. 11.
Figure 13:
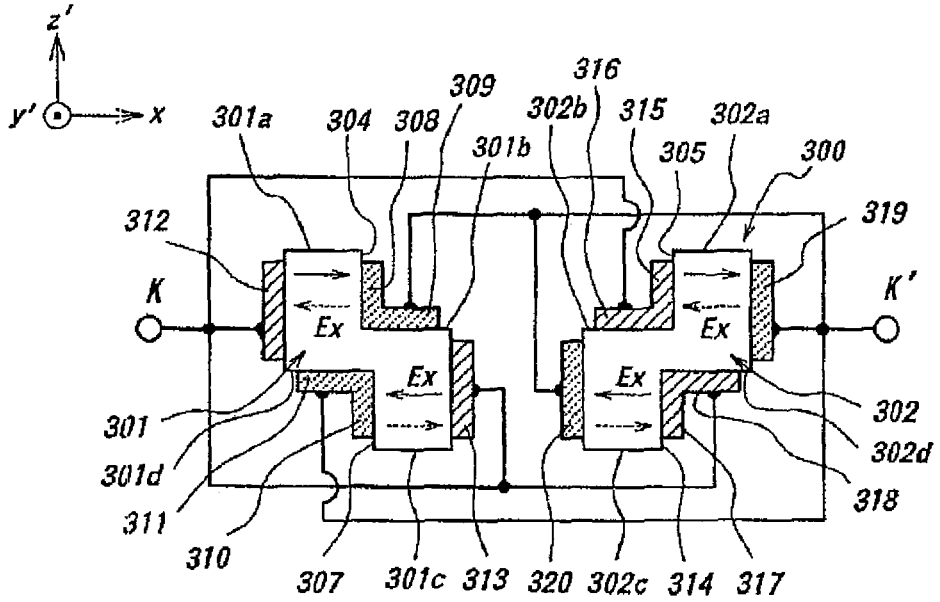
FIG. 13 is a I-I' cross-sectional view of the tuning fork tines of FIG. 12 and illustrating electrode construction.

FIG. 11 shows a general view of a flexural mode, tuning fork, quartz crystal resonator 300 which constructs a quartz crystal unit of the fifth embodiment of the present invention and its coordinate system. FIG. 12 is a plan view of the resonator 300 shown in FIG. 11, and FIG. 13 shows a I-I' cross-sectional view of tuning fork tines shown in FIG. 12. As shown in FIG. 11, the resonator 300 is formed from a quartz crystal wafer rotated about x-axis and with a cut angle θ. In general, a cut angle θ has a value of 0° to 10°. Here, y' and z' axes are the new y and z axes obtained after the rotation about the x-axis. This flexural mode, tuning fork, quartz crystal resonator 300 comprises tuning fork tines 301, 302 and tuning fork base 303, and has thickness t. In addition, the tuning fork tine 301 has step difference portions, and the step difference portion 304 (the inner side of upper surface portion 301a) is formed between upper surface portion 301a and medium surface portion 301b. The medium surface portion 301b and the step difference portion 304 extend to the tuning fork base 303.

Also, similar to the tuning fork tine 301, the medium surface portion 302b and the step difference portion 305 are formed on the obverse face of the tuning fork tine 302, as shown in FIG. 12 and FIG. 13, furthermore, the upper surface portion 303a, the medium surface portion 303b and the step difference portion 306 are formed on the tuning fork base 303. Namely, as shown in FIG. 12, the tuning fork tine 301 of this resonator 300 has the step difference portion 304, while the tuning fork tine 302 has the step difference portion 305, these step difference portions extend to the tuning fork base 303, and the step difference portions 304 and 305 are connected at the step difference portion 306 of the tuning fork base 303. In this embodiment the step difference portions of tuning fork tines are constructed in series, but embodiment of the present invention includes a plurality of step difference portions divided in the length direction of the tuning fork tines.

In addition, as shown in FIG. 13, a structure similar to the obverse face of the tuning fork tine 301, is also constructed on the reverse face. The step difference portion 307 is formed between the lower surface portion 301c and the medium surface portion 301d and the step difference portion 307 extend to the tuning fork base 303. Here, the step difference portion 304 of the obverse face turns toward the inside of the tuning fork tine 301 and the step difference portion 307 of the reverse face turns toward the outside of the tuning fork tine 301. The electrode 308 is disposed on the step difference portion 304 and the electrode 309, which is connected to the electrode 308, is disposed on the medium surface portion 301b.The electrode 310 is disposed on the step difference portion 307 and the electrode 311, which is connected to the electrode 310, is disposed on the medium surface portion 301d. In addition, the electrode 312 is disposed on the side of the tine 301 opposite the electrode 308 disposed on the step difference portion 304 and the electrode 313 is disposed on the side of the tine 301 opposite the electrode 310 disposed on the step difference portion 307.

Thus, by this arrangement of electrodes, an electric field Ex occurs perpendicularly between the electrodes 308 and 312 and the electrodes 310 and 313. Similarly, the tuning fork tine 302 also has the step difference and the electrodes of left and right symmetry to the tuning fork tine 301. Namely, the step difference portions 305, 314, the upper surface portion 302a, the medium surface portion 302b and the medium surface portion 302d are constructed on the obverse and the reverse faces of the tuning fork tine 302. The electrode 315 is disposed on the step difference portion 305 and the electrode 316, which is connected to the electrode 315, is disposed on the medium surface portion 302b, and also the electrode 317 is disposed on the step difference portion 314 and electrode 318, which is connected to the electrode 317, is disposed on the medium surface portion 302d. In addition, the electrode 319 is disposed on the side of the tine 302 opposite the electrode 315 and the electrode 320 is disposed on the side of the tine 302 opposite the electrode 317. In more detail, the first set of electrodes 308, 309, 310, 311, 319 and 320 are the same electrical polarity and the second set of electrodes 312, 313, 315, 316, 317 and 318 are the opposite electrical polarity to the first set of electrodes. As a result, two electrode terminals K-K' are constructed.

Now, when an alternating voltage is applied between the electrode terminals K-K', an electric field Ex occurs perpendicularly and alternately between the electrodes, as shown by the solid and broken arrow signs in FIG. 13 and a flexural mode vibration can be easily excited, so that a flexural mode, tuning fork, quartz crystal resonator is obtained with a small series resistance RI and a high quality factor Q because the electromechanical transformation efficiency for the resonator becomes large.

Figure 14:
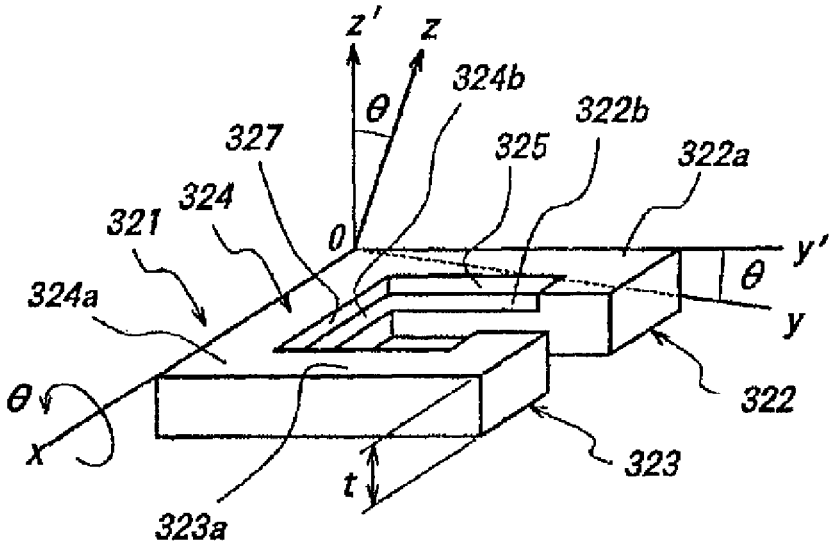
FIG. 14 is a general view of a flexural mode, tuning fork, quartz crystal resonator constructing a quartz crystal unit of the sixth embodiment of the present invention and its coordinate system.
Figure 15:
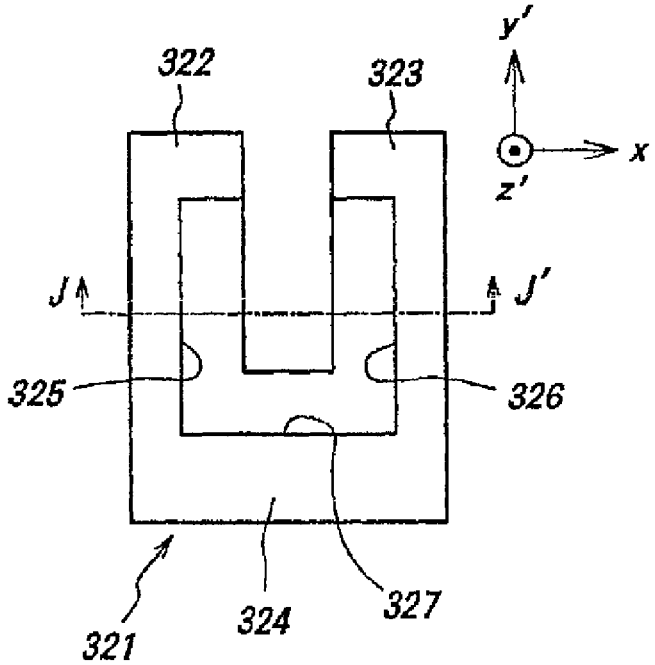
FIG. 15 is a plan view of the flexural mode quartz crystal resonator of FIG. 14.
Figure 16:
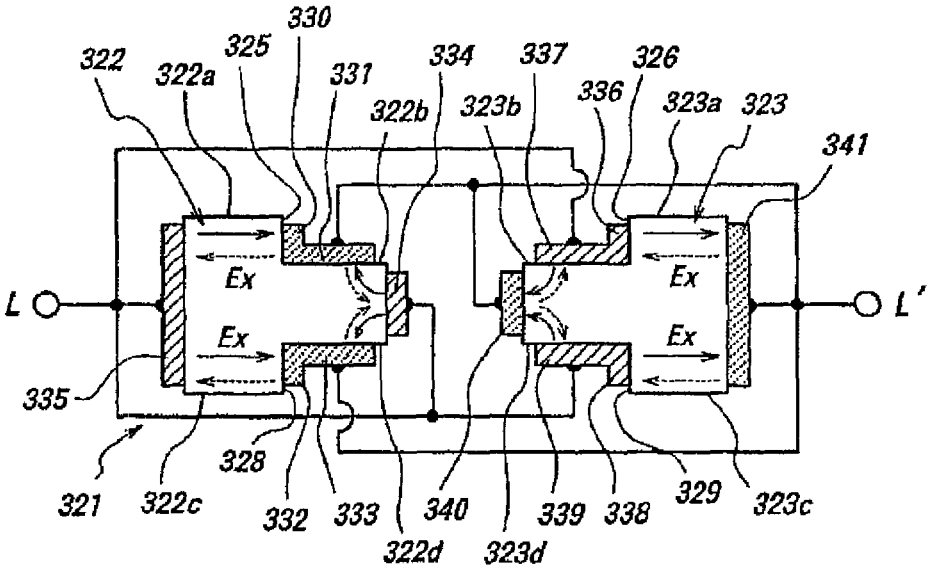
FIG. 16 is a J-J' cross-sectional view of the tuning fork tines of FIG. 15 and illustrating electrode construction.

FIG. 14 shows a general view of a flexural mode, tuning fork, quartz crystal resonator 321 which constructs a quartz crystal unit of the sixth embodiment of the present invention and its coordinate system. FIG. 15 is a plan view of the resonator 321 of FIG. 14, and FIG. 16 shows a J-J' cross-sectional view of tuning fork tines of FIG. 15. Here, the coordinate system in this embodiment is the same as that shown in FIG. 11. A flexural mode, tuning fork, quartz crystal resonator 321 comprises the tuning fork tines 322, 323 and the tuning fork base 324, and has a thickness t. In addition, the tuning fork tine 322 has the step difference, as shown in FIG. 14 and FIG. 16. The upper surface portion 322a, the medium surface portions 322b, 322d, the step difference portions 325, 328 and the lower surface portion 322c are formed on the tuning fork tine 322. The medium surface portions 322b, 322d, and the step difference portions 325, 328 extend to the tuning fork base 324 whose obverse face is shaped to the upper surface portion 324a, the medium surface portion 324b and the step difference portion 327 and whose reverse face has the same shape as the obverse face (though the shape is not shown in the FIGS. 14 and 15).

In the same way, the upper surface portion 323a, the medium surface portions 323b, 323d, the step difference portions 326, 329 and the lower surface portion 323c are formed on the tuning fork tine 323. The medium surface portions 323b, 323d and the step difference portions 326, 329 extend to the tuning fork base 324 in a manner similar to said tuning fork tine 322. In other words, as shown in FIGS. 15 and 16, the tuning fork tines 322 and 323 have the step difference portions 325 and 326 which extend to the tuning fork base 324 and connect at the step difference portion 327. In addition, the step difference portions 325 and 328 are constructed at the obverse and the reverse faces of the tuning fork tine 322 and also the step difference portions 326 and 329 are constructed on the obverse and the reverse faces of the tuning fork tine 323. In this embodiment, the step difference portions 325, 328 and 326, 329 turn to the inside of the tuning fork tines 322 and 323, the same effect is obtained when said step difference portions 325, 328 and 326, 329 turn to outside of said tines 322 and 323, as shown in FIGS. 17, 18, 19 and 21.

Furthermore, the electrode 330 is disposed on the step difference portion 325 and electrode 331, which is connected to the electrode 330, is disposed on the medium surface portion 322b, electrode 332 is also disposed on the step difference portion 328 and electrode 333, which is connected to the electrode 332, is disposed on the medium surface portion 322d, and electrodes 334, 335 are disposed on both sides of the tuning fork tine 322. Namely, electrode 335 is disposed opposite electrodes 330 and 332 which are of opposite electrical polarity from said electrode 335. Similar to said tuning fork tine 322, the tuning fork tine 323 also has the step difference and electrodes of left and right symmetry to said tuning fork tine 322.

That is to say, the tuning fork tine 323 has the step difference portions 326, 329, the upper surface portion 323a, the medium surface portions 323b, 323d and the lower surface portion 323c, and the step difference portion 326 has electrode 336, which is connected to electrode 337, disposed on the medium surface portion 323b, while the step difference portion 329 has electrode 338, which is connected to electrode 339, disposed on the medium surface portion 323d, and electrodes 340, 341 are disposed on both sides of the tuning fork tine 323. Namely, electrode 341 is disposed in opposition to electrodes 336 and 338 which are of opposite electrical polarity from said electrode 341. In full detail, as shown in FIG. 16, the first set of electrodes 330, 331, 332, 333, 340 and 341 have the same electrical polarity, while the second set of electrodes 334, 335, 336, 337, 338 and 339 are of opposite electrical polarity to the first set of electrodes. Two electrode terminals L-L' are able to be constructed.

When an alternating voltage is applied between the two electrode terminals L-L', an electric field Ex occurs perpendicular to and alternately between the electrodes, as shown by the solid and broken arrow signs in FIG. 16 and a flexural mode vibration may be easily excited, so that a flexural mode, tuning fork, quartz crystal resonator is obtained with a small series resistance $R_1$ and a high quality factor Q because the electromechanical transformation efficiency for the resonator becomes large. In this embodiment, the tuning fork tines 322 and 323 have the medium surface portions 322b, 322d, 323b and 323d on the inside of the said tines, but, the same effect as that of said shape can be obtained when the medium surface portions are constructed on the outside of the tuning fork tines 322 and 323, as shown in FIGS. 17, 18, 19 and 20.

Figure 17:
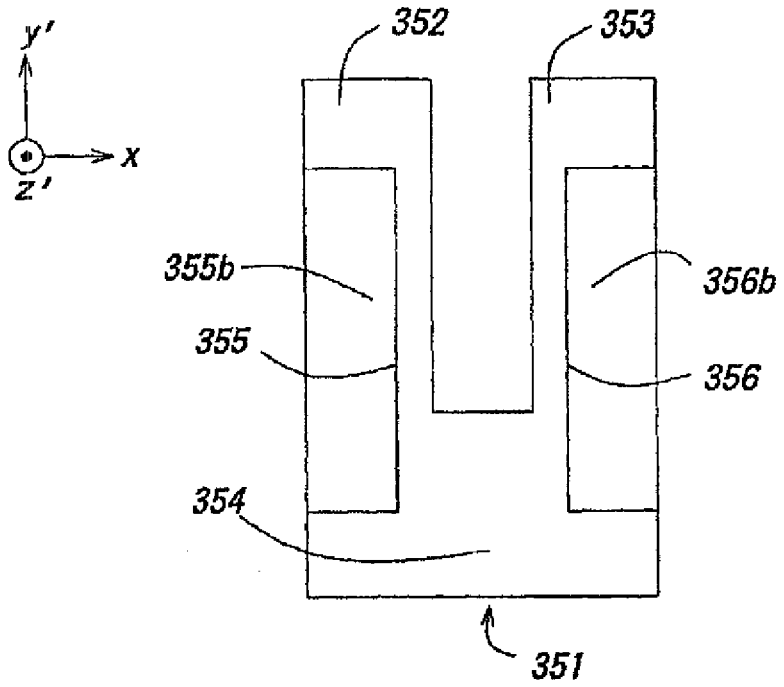
FIG. 17 is a plan view of a flexural mode quartz crystal resonator constructing a quartz crystal unit of the seventh embodiment of the present invention.

FIG. 17 shows a plan view of a flexural mode quartz crystal resonator 351 which constructs a quartz crystal unit of the seventh embodiment of the present invention. The resonator 351 comprises tuning fork tines 352, 353 and tuning fork base 354. The tines 352 and 353 have step difference portions 355, 356 and medium surface portions 355b, 356b respectively. In this embodiment, the step difference portions 355, 356 and the medium surface portions 355b, 356b extend into the tuning fork base 354. Thus, the step difference portions turn to outside of said tines, and the medium surface portions are constructed on the outside of said tines. In addition, electrode construction of the tuning fork tines is not shown in FIG. 17, but it is performed similar to that of FIG. 16. This resonator also has the same effect as that of FIG. 14.

Figure 18:
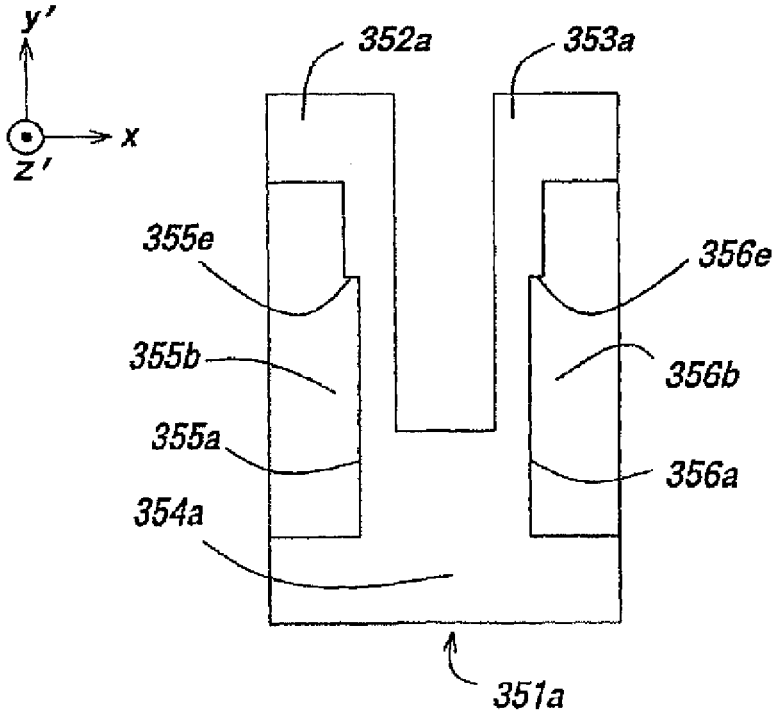
FIG. 18 is a plan view of a flexural mode quartz crystal resonator constructing a quartz crystal unit of the eighth embodiment of the present invention.

FIG. 18 shows a plan view of a flexural mode quartz crystal resonator 351a which constructs a quartz crystal unit of the eighth embodiment of the present invention. The resonator 351a comprises tuning fork tines 352a, 353a and tuning fork base 354a. The tines 352a and 353a have step difference portions 355a, 356a along the direction of length thereof and medium surface portions 355b, 356b respectively. In addition, the step difference portions 355a and 356a have the respective step portions 355e and 356e versus the direction of length of the tines 352a and 353a. Namely, In this embodiment, two step difference portions are constructed at each tine and the two step difference portions are connected via a step portion. In more detail, two step difference portions which are connected via a step portion may be constructed on at least one face of obverse and reverse faces of tuning fork tines. In this embodiment, the step difference portions 355a, 356a and the medium surface portions 355b, 356b extend into the tuning fork base 354a. Electrodes for this resonator are not disposed in FIG. 18, but they are disposed on the step difference portions, the medium surface portions and side faces of the tuning fork tines similar to that of FIG. 16. Thus, by constructing the electrodes and the step difference portions connected via the step portion, a tuning fork, quartz crystal resonator capable of vibrating in fundamental mode very easily can be obtained with a small series resistance $R_1$ and a high quality factor Q because the quantity of charges which generate on the step difference portions and the side faces of the tuning fork tines can be controlled and the second and third overtone modes for the resonator which are unwanted vibration modes can be substantially suppressed in vibration.

In this embodiment, each tuning fork tine has two step difference portions on the obverse face along the direction of length thereof which are connected via a step portion, but this invention is not limited to this. That is to say, the present invention also includes a flexural mode, tuning fork, quartz crystal resonator comprising tuning fork tines and a tuning fork base that are formed integrally, a plurality of step difference portions constructed at said tuning fork tines along the direction of length thereof, and at least two of the plurality of step difference portions being connected via at least one step portion, in other words, the at least two step difference portions are connected via at least one step portion. In more detail, a plurality of step difference portions which are connected via at least one step portion may be constructed on at least one face of obverse and reverse faces of tuning fork tines.

Figure 19:
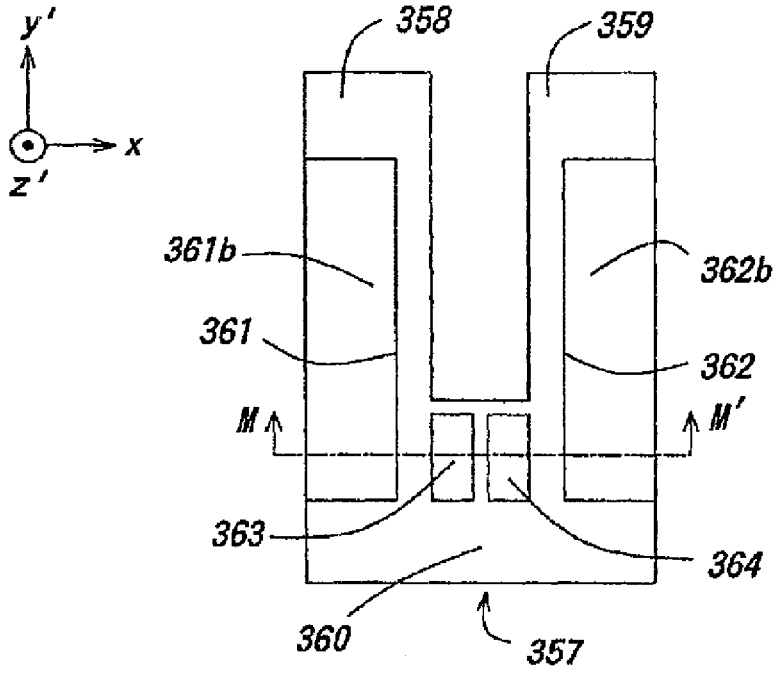
FIG. 19 is a plan view of a flexural mode quartz crystal resonator constructing a quartz crystal unit of the ninth embodiment of the present invention.
Figure 21:
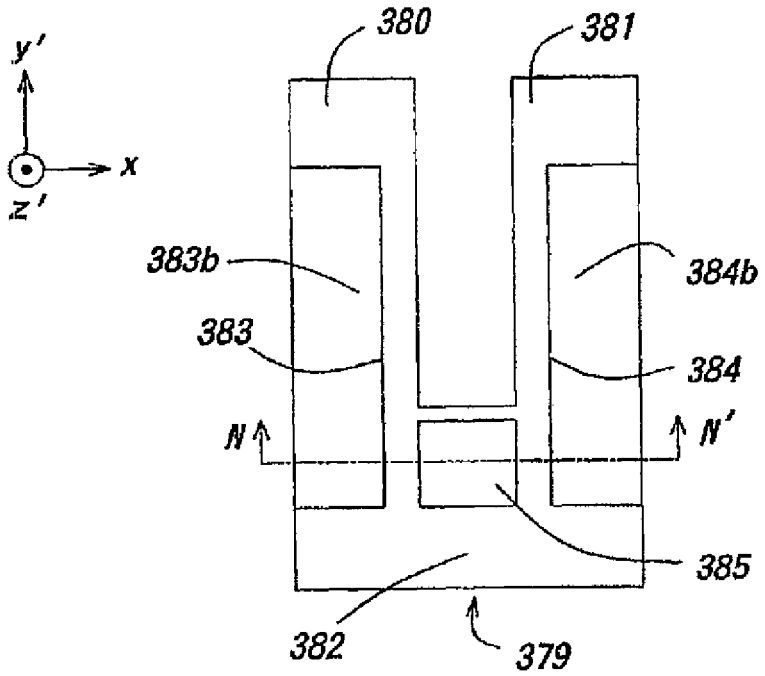
FIG. 21 is a plan view of a flexural mode quartz crystal resonator constructing a quartz crystal unit of the tenth embodiment of the present invention.

It is needless to say that this concept can be also applied to the flexural mode, tuning fork, quartz crystal resonators shown in FIGS. 1(a), 1(b), 5, 7 and 9, and also applied to tuning fork quartz crystal resonators which will be shown in FIGS. 19 and 21. For example, the present invention also includes a flexural mode, tuning fork, quartz crystal resonator comprising tuning fork tines *each having a first* (*inner or outer*) *side surface and a second* (*outer or inner*) *side surface opposite the first side surface* and a tuning fork base that are formed integrally, *and* a groove [constructed, respectively, on] *formed in each of* obverse and reverse faces (*first and second main surfaces*) of each tuning fork tine. Namely, as an example of the respective grooves, the groove [constructed on] *formed in* the obverse face *of each of the tuning fork tines* has at least two step difference portions, *i.e., at least two stepped portions including a first stepped portion and a second stepped portion connected to the first stepped portion* along the length direction of *each of* the tuning fork [tine and ] *tines, as shown in FIG. 18, and the first stepped portion is connected to the second stepped portion through a third stepped portion so that each of the first and second stepped portions of the groove formed in the obverse face of each of the tuning fork tines is formed directly opposite the first side surface of the corresponding one of the tuning fork tines and is directly connected to the third stepped portion formed in a direction different from that of each of the first and second stepped portions, i.e., not opposite the first side surface. In addition, as shown in FIG. 18, the groove formed in the obverse face of each of the tuning fork tines has a first width and a second width greater than the first width so that the first width is greater than a first distance in the width direction of the groove measured from an outer edge of the first stepped portion of the groove to an outer edge of the first side surface of the corresponding one of the tuning fork tines, so that the second width is greater than a second distance in the width direction of the groove measured from an outer edge of the second stepped portion of the groove to an outer edge of the first side surface of the corresponding one of the tuning fork tines, and so that the second distance is less than the first distance, namely, each of the first and second widths is greater than each of the first and second distances, while* the groove [constructed on] *formed in* the reverse face *of each of the tuning fork tines* has at least three step difference portions, *i.e., at least three stepped portions including first, second and third stepped portions* along the length direction of *each of* the tuning fork [tine,] *tines,* and at least two of the at least three [step difference] *stepped* portions are connected via at least one [step] *stepped* portion. *Namely, an example of this relation shows that the first stepped portion is connected to the second stepped portion through a stepped portion so that each of the first and second stepped portions of the groove formed in the reverse face of each of the tuning fork tines is formed opposite the first side surface of the corresponding one of the tuning fork tines and is directly connected to the stepped portion. In addition, the groove formed in the obverse face of each of the tuning fork tines has a fourth stepped portion directly opposite a fifth stepped portion in the length direction, the fourth stepped portion is directly connected to the first stepped portion and the fifth stepped portion is directly connected to the second stepped portion, as shown in FIG. 18. Similar to this, the groove formed in the reverse face of each of the tuning fork tines has a fourth stepped portion directly opposite a fifth stepped portion in the length direction, the fourth stepped portion is directly connected to the first stepped portion and the fifth stepped portion is directly connected to the second stepped portion. In other words, the groove formed in each of the obverse and the reverse faces of each of the tuning fork tines has a first surface and a second surface connected to the first surface through a third surface, and a fourth surface directly opposite a fifth surface in the length direction. Each of the first, second and third surfaces has a first end portion and a second end portion, and also, the groove is formed in each of the obverse and the reverse faces of each of the tuning fork tines so that each of the first and second surfaces of the groove formed in each of the obverse and the reverse faces of each of the tuning fork tines is formed directly opposite the first side surface of the corresponding one of the tuning fork tines, and the first end portion of the first surface is directly connected to the first end portion of the third surface and the first end portion of the second surface is directly connected to the second end portion of the third surface, and so that an end portion of the fourth surface is directly connected to the second end portion of the first surface and an end portion of the fifth surface is directly connected to the second end portion of the second surface. In addition, as shown in FIG. 18, the groove formed in at least one of the obverse and reverse faces of each of the tuning fork tines comprises a first groove portion having a first width and the first surface directly opposite the first side surface, a second groove portion having a second width different from i.e., greater than the first width and the second surface directly opposite the first side surface, and a third groove portion including the third surface formed in a direction different from each of the first and second surfaces, i.e., not opposite the first side surface so that each of the first and second surfaces is formed along the length of the corresponding one of the tuning fork tines. A first distance in the width direction of the first groove portion measured from a first outer edge of the first surface of the first groove portion to a first outer edge of the first side surface of the corresponding one of the tuning fork tines is greater than a second distance in the width direction of the second groove portion measured from a second outer edge of the second surface of the second groove portion to a second outer edge of the first side surface of the corresponding one of the tuning fork tines, and the first width of the first groove portion is greater than the first distance in the width direction of the first groove portion and the second width of the second groove portion is greater than the second distance in the width direction of the second groove portion. Namely, each of the first and second widths is greater than each of the first and second distances.* For two tuning fork tines, each tine has at least two and at least three [step difference] *stepped* portions at obverse and reverse faces and the at least three [step difference] *stepped* portions at least two of which are connected via at least one [step] *stepped* portion, are [constructed] *formed* at a [different] tuning fork tine. Similarly, for more than three tines, at least three [step difference] *stepped* portions are [constructed] *formed* at [a different] *each* tuning fork tine. This resonator also has the same effect as that of FIG. 18.

FIG. 19 shows a plan view of a flexural mode quartz crystal resonator 357 which constructs a quartz crystal unit of the ninth embodiment of the present invention. The resonator 357 comprises tuning fork tines 358, 359 and tuning fork base 360. The tines 358 and 359 have step difference portions 361, 362 along the direction of length thereof and medium surface portions 361b, 362b respectively, with the step difference portions 361 and 362 extending into the base 360. In addition, the base 360 has the grooves 363 and 364 between the step difference portions 361 and 362.

Figure 20:
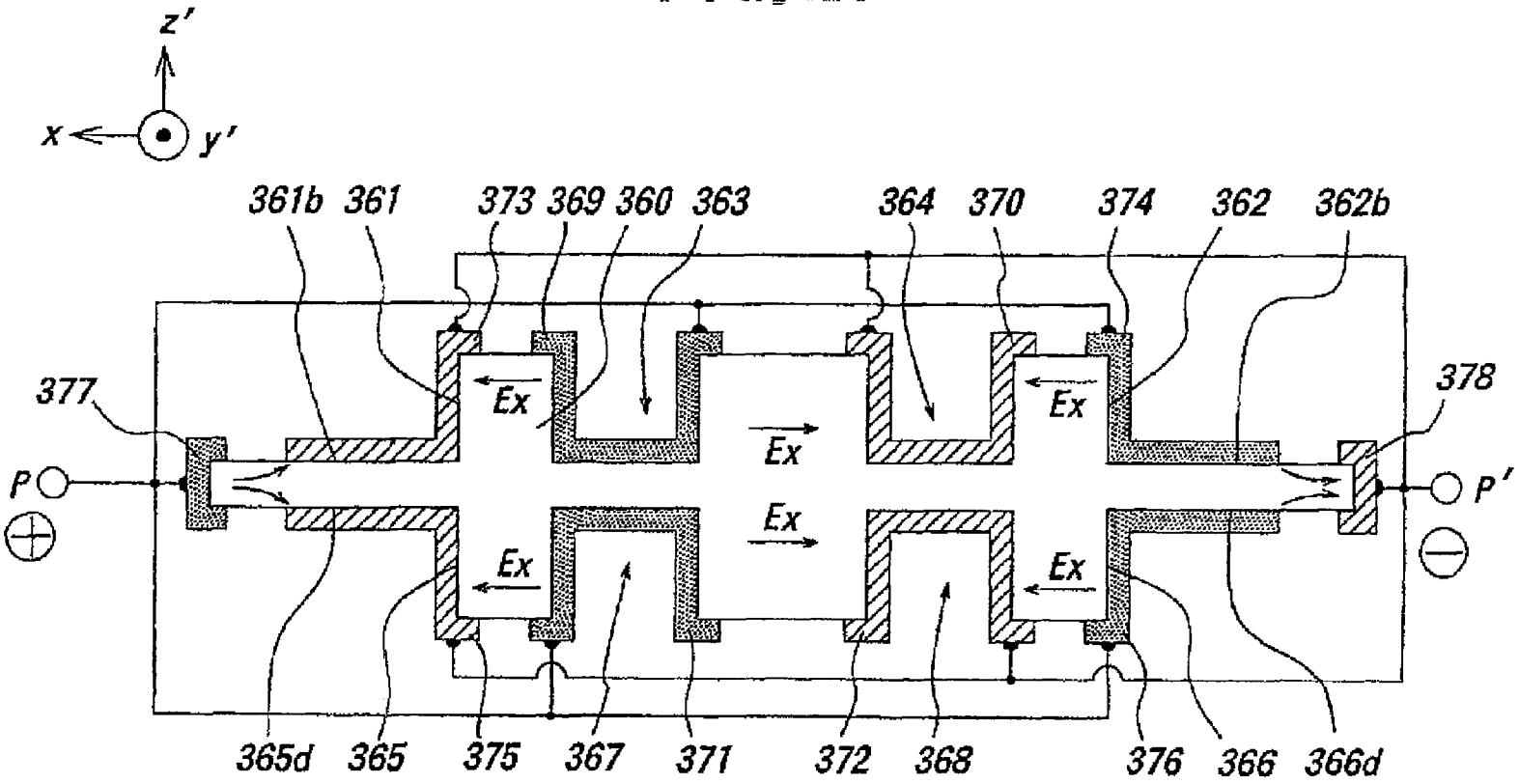
FIG. 20 is a M-M' cross-sectional view of the tuning fork tines of FIG. 19 and illustrating electrode construction.

FIG. 20 shows a M-M' cross-sectional view of the tuning fork base 360 for the flexural mode, tuning fork, quartz crystal resonator 357 of FIG. 19. In FIG. 20, the shape of the electrode construction within the tuning fork base 360 for the quartz crystal resonator of FIG. 19 is described in detail. The section of the tuning fork base 360 which couples to the tuning fork tine 358 has the step difference portions 361, 365 and the medium surface portions 361b, 365d cut into the obverse and the reverse faces of the base 360. Also, the section of the tuning fork base 360 which couples to the tuning fork tine 359 has the step difference portions 362, 366 and the medium surface portions 362b, 366d cut into the obverse and the reverse faces of the base 360. In addition to these step difference portions, the tuning fork base 360 has the grooves 363 and 364 cut between the step difference portions 361 and 362, and also, the base 360 has the grooves 367 and 368 cut between the step difference portions 365 and 366.

Furthermore, the step difference portions 361 and 365 have the first electrodes 373 and 375 which are connected to electrodes disposed on the medium surface portions 361b and 365d, both of which have the same electrical polarity, the grooves 363 and 367 have the second electrodes 369 and 371 both of the same electrical polarity, the grooves 364 and 368 have the third electrodes 370 and 372 both of the same electrical polarity, the step difference portions 362 and 366 have the fourth electrodes 374 and 376 which are connected to electrodes disposed on the medium surface portions 362b and 366d, both of which have same electrical polarity and the sides of the base 360 have the fifth and sixth electrodes 377 and 378 which extend into the sides of the tines 358 and 359 respectively, each of which has opposite electrical polarity. In more detail, the first, third, and sixth electrodes 373, 375, 370, 372 and 378 have the same electrical polarity, while the second, fourth and fifth electrodes 369, 371, 374, 376 and 377 have the opposite electrical polarity to the others. Two electrode terminals P-P' are constructed. That is, the electrodes disposed inside the grooves constructed opposite each other in the thickness (z' axis) direction have the same electrical polarity. Also, the electrodes disposed opposite each other across adjoining grooves or adjoining step difference portion and groove have opposite electrical polarity.

Now, when a direct voltage is applied between the electrode terminals P-P' (P terminal: plus, P' terminal: minus), an electric field Ex occurs in the arrow direction as shown in FIG. 20. As the electric field Ex occurs perpendicular to the electrodes disposed on the tuning fork base, the electric field Ex has a very large value and a large distortion occurs at the tuning fork base, so that a flexural mode, tuning fork, quartz crystal resonator is obtained with a small series resistance $R_1$ and a high quality factor Q, even if it is miniaturized.

FIG. 21 shows a plan view of a flexural mode quartz crystal resonator 379 which constructs a quartz crystal unit of the tenth embodiment of the present invention. The resonator 379 comprises tuning fork tines 380, 381 and tuning fork base 382. The tines 380 and 381 have step difference portions 383, 384 along the direction of length thereof and medium surface portions 383b, 384b respectively, with the step difference portions 383 and 384 extending into the base 382. In addition, the base 382 has the groove 385 between the step difference portions 383 and 384.

Figure 22:
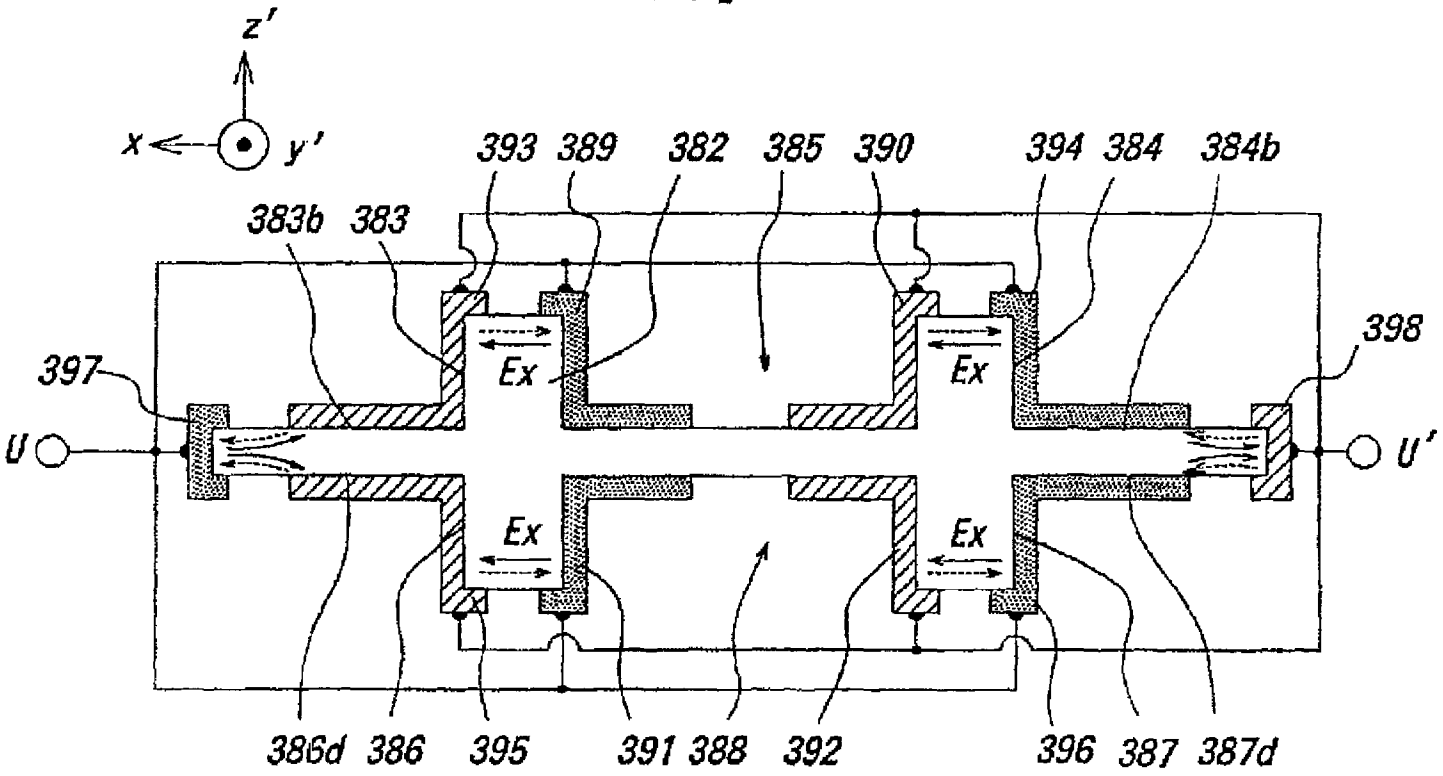
FIG. 22 is a N-N' cross-sectional view of the tuning fork base of FIG. 21 and illustrating electrode construction.

FIG. 22 shows a N-N' cross-sectional view of the tuning fork base 382 for the flexural mode, tuning fork, quartz crystal resonator 379 of FIG. 21. In FIG. 22, the shape of the electrode construction within the tuning fork base 382 for the quartz crystal resonator of FIG. 21 is described in detail. The section of the tuning fork base 382 which couples to the tuning fork tine 380 has the step difference portions 383, 386 and the medium surface portions 383b, 386d cut into the obverse and the reverse faces of the base 382. Also, the section of the tuning fork base 382 which couples to the tuning fork tine 381 has the step difference portions 384, 387 and the medium surface portions 384b, 387d cut into the obverse and the reverse faces of the base 382. In addition to these step difference portions, the tuning fork base 382 has the groove 385 cut between the step difference portions 383 and 384, and also, the base 382 has the groove 388 cut between the step difference portions 386 and 387.

Furthermore, the step difference portions 383 and 386 have the first electrodes 393 and 395 which are connected to electrodes disposed on the medium surface portions 383b and 386d, both of which have the same electrical polarity, the grooves 385 and 388 have the second electrodes 389 and 391 both of the same electrical polarity and the third electrodes 390, 392 both of the same electrical polarity, the step difference portions 384 and 387 have the fourth electrodes 394 and 396 which are connected to electrodes disposed on the medium surface portions 384b and 387d, both of which have same electrical polarity and the sides of the base 382 have the fifth and sixth electrodes 397 and 398 which extend into the sides of the tines 380 and 381 respectively, each of which has opposite electrical polarity. In more detail, the first, third, and sixth electrodes 393, 395, 390, 392 and 398 have the same electrical polarity, while the second, fourth and fifth electrodes 389, 391, 394, 396 and 397 have the opposite electrical polarity to the others. Two electrode terminals U-U' are constructed. That is, the electrodes disposed inside the grooves constructed opposite each other in the thickness (z' axis) direction have the same electrical polarity. Also, the electrodes disposed opposite each other across adjoining step difference portion and groove have opposite electrical polarity. In addition, the medium surface portions extend to a side of the tuning fork tines as described in the above embodiments.

Now, when an alternating current (AC) voltage is applied between two electrode terminals U-U', an electric field Ex occurs alternately along the arrow directions shown by the solid and broken lines. As a result, a flexural mode is generated in the inverse phase. In addition, as the electric field $E_X$ occurs perpendicular to the electrodes between the electrodes disposed on the sides of the grooves and the step difference portions, the electric field $E_X$ becomes large, namely, a markedly large distortion occurs at the tuning fork base, so that a flexural mode, tuning fork, quartz crystal resonator is obtained with a small series resistance $R_1$ and a high quality factor Q when it is miniaturized. In the this embodiments, though the electrodes 397 and 398 which are of opposite electrical polarity at both sides of the tuning fork base 382, are disposed, the present invention is not limited to this, for example, the present invention includes the construction of the electrodes 397 and 398 being not disposed on the both sides or the construction of the electrodes 397 and 398 being connected to electrodes disposed on the respective adjoining medium surface portions. This electrode construction is also applied to that of both outside faces of the tuning fork tines.

Figure 23:
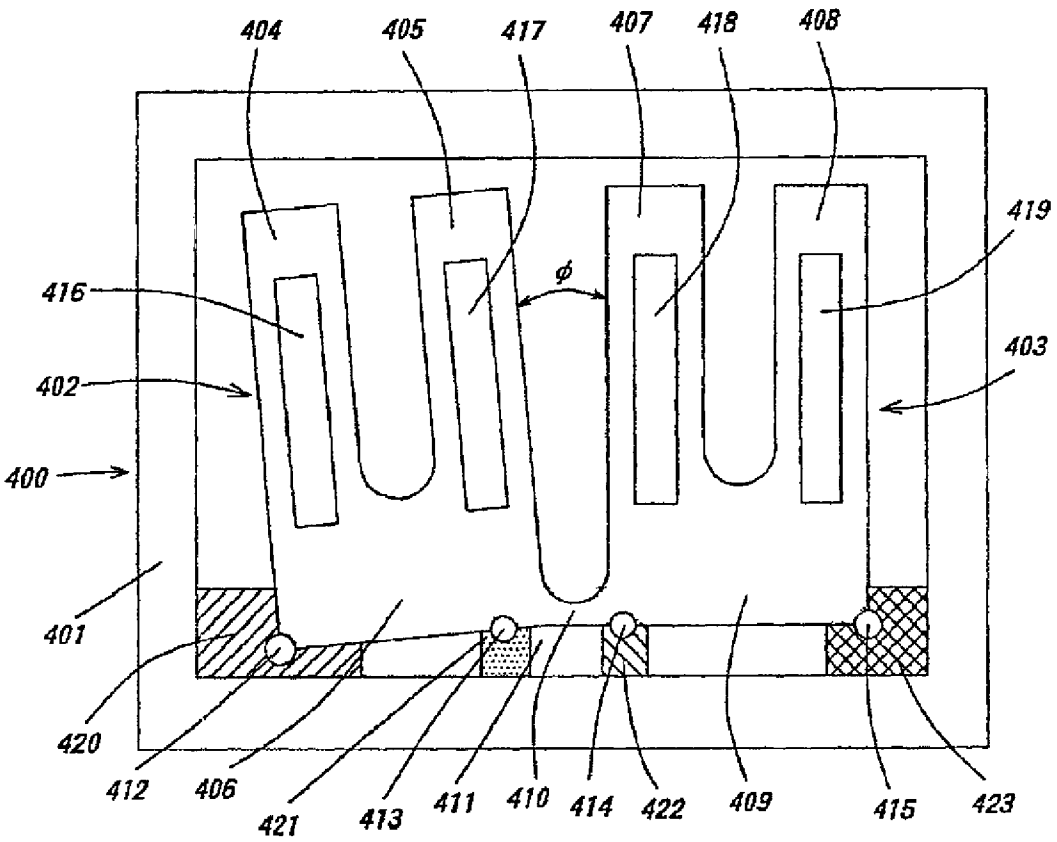
FIG. 23 shows a plan view of a quartz crystal unit of the eleventh embodiment of the present invention and omitting a lid, which has two flexural mode, tuning fork, quartz crystal resonators with grooves connected and formed integrally at each tuning base via connecting portion and have an angle $\phi$ of separation.

FIG. 23 shows a plan view of a quartz crystal unit 400 of the eleventh embodiment of the present invention and omitting a lid. The quartz crystal unit 400 comprises a case 401, two flexural mode, tuning fork, quartz crystal resonators 402, 403 and a lid not shown in FIG. 23. The one tuning fork, quartz crystal resonator 402 comprises tuning fork tines 404, 405 and tuning fork base 406 and similarly, the other tuning fork, quartz crystal resonator 403 comprises tuning fork tines 407, 408 and tuning fork base 409. The tuning fork bases 406 and 409 for the resonators 402 and 403 are formed integrally via a connecting portion 410. In addition, the two quartz crystal resonators are formed with an angle $\phi$ of separation of 0° to 30°. An object of embodiments of the present invention may be achieved even if the same-designed resonators have the angle $\phi$=0° because flexural mode quartz crystal resonators of tuning fork type, which are manufactured in mass production, have a distribution of frequency temperature behaviours due to manufacturing tolerances. In other words there will be small differences between the two resonators. Moreover, the quartz crystal resonators 402 and 403 in this embodiment have the same grooves and electrodes as those of the tuning fork, quartz crystal resonator 21 described in FIG. 2, respectively. Also, it is possible to change a peak temperature point by changing a ratio of a thickness of groove and a thickness of tuning fork tines Here, ⌈formed integrally⌋ implies that a plurality of individual flexural mode, tuning fork, quartz crystal resonators are connected and formed between each tuning fork base via a connecting portion, when said quartz crystal resonators were removed from a quartz crystal wafer and also, includes the quartz crystal resonators cut and removed at the connecting portion after they were fixed on a mounting portion of a case by adhesives or solder.

Also, the tuning fork bases 406 and 409 are fixed at plural locations of a mounting portion 411 constructed at the case 401 by conductive adhesives 412, 413, 414 and 415 or solder. In this embodiment the bases are fixed at four locations of the mounting portion, but they may be fixed at location more than at least two. In addition, the tuning fork tines 404 and 405 have the grooves 416 and 417, and the tuning fork tines 407 and 408 have the grooves 418 and 419, in this embodiment the grooves constructed at the tuning fork tines extend into the tuning fork bases 406 and 409, but the grooves may be constructed at the tuning fork tines at least.

Furthermore, four electrodes 420, 421, 422 and 423 are disposed on the mounting portion 411 and connected to the respective electrodes disposed on the tuning fork bases 406 and 409, the electrodes of which have opposite electrical polarity. Namely, the tuning fork, quartz crystal resonator 402 and 403 in this embodiment have two electrode terminals, respectively. Additionally, as an another example of the electrode construction in this embodiment, at least two electrodes, for example, the electrodes 421 and 422 may be constructed such as common electrode (one electrode).

In addition, it is not visible in FIG. 23, but the four electrodes 420, 421, 422 and 423 disposed on the mounting portion 411 extend into the reverse face of the case 401 or at least two of said electrodes are of the common electrode and three electrodes or two electrodes are disposed on the reverse face of the case 401.

In more detail, the electrodes disposed on the reverse face of the case are constructed so that the flexural mode, tuning fork, quartz crystal resonators 402 and 403 are connected electrically in parallel. Namely, when two resonators 402 and 403 are excited by an electrical signal, both resonators vibrate in flexural mode in parallel electrically.

Figure 24:
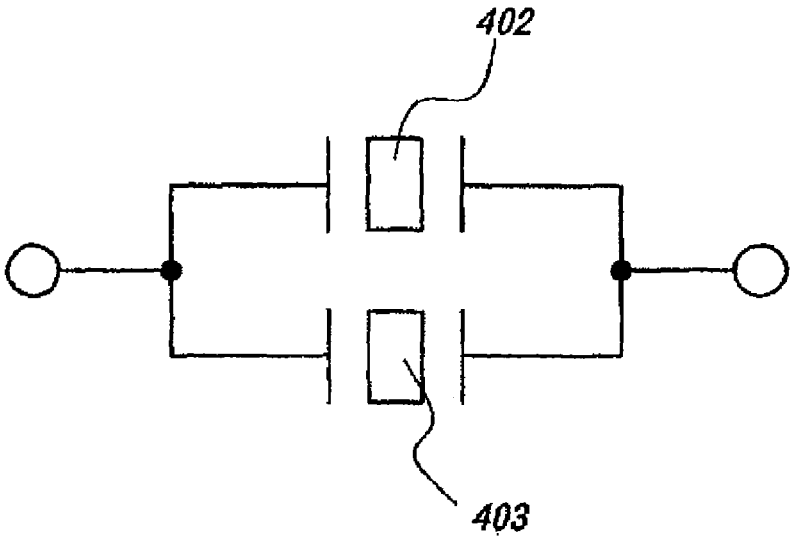
FIG. 24 shows a diagram of an electrical connection for the flexural mode quartz crystal resonators of FIG. 23.

Thus, by constructing two flexural mode quartz crystal resonators of tuning fork type which are connected at each tuning fork base via a connecting portion and formed integrally with an angle $\phi$ of separation no more than 30° between each resonator, each flexural mode, tuning fork, quartz crystal resonator has a different frequency temperature behaviour dependent on the angle $\phi$. Namely, flexural mode, tuning fork, quartz crystal resonators can be obtained with different peak temperature points. In addition, an improvement of the frequency temperature behaviour for the tuning fork, quartz crystal resonator can be performed by electrically connecting the two quartz crystal resonators of tuning fork type in parallel. In order to get excellent frequency temperature behaviour, frequency difference for the both resonators 402 and 403 may be preferably less than 30 ppm. An electrical connection diagram for both flexural mode, tuning fork, quartz crystal resonators 402, 403 is shown in FIG. 24. The resonators are connected in parallel electrically.

Figure 25:
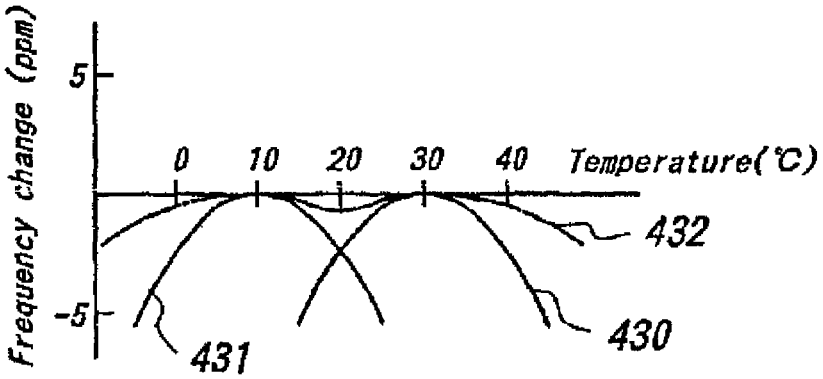
FIG. 25 shows an example of frequency temperature behaviour of the quartz crystal unit of said eleventh embodiment.

FIG. 25 shows an example of frequency temperature behaviour of the quartz crystal unit of said eleventh embodiment with the above-described flexural mode, tuning fork, quartz crystal resonators 402, 403. The quartz crystal resonator 402 shown in FIG. 23 has frequency temperature behaviour 430 whose peak temperature point is approximately 30° C., while the resonator 403 shown in FIG. 23 has frequency temperature behaviour 431 whose peak temperature point is approximately 10° C. The compensated frequency temperature behaviour for both quartz crystal resonators connected in parallel electrically is shown by the curve 432. Thus, the quartz crystal unit with the integrally formed flexural mode, tuning fork, quartz crystal resonator embodying the present invention may be miniaturized and obtained with excellent frequency temperature behaviour.

Figure 26:
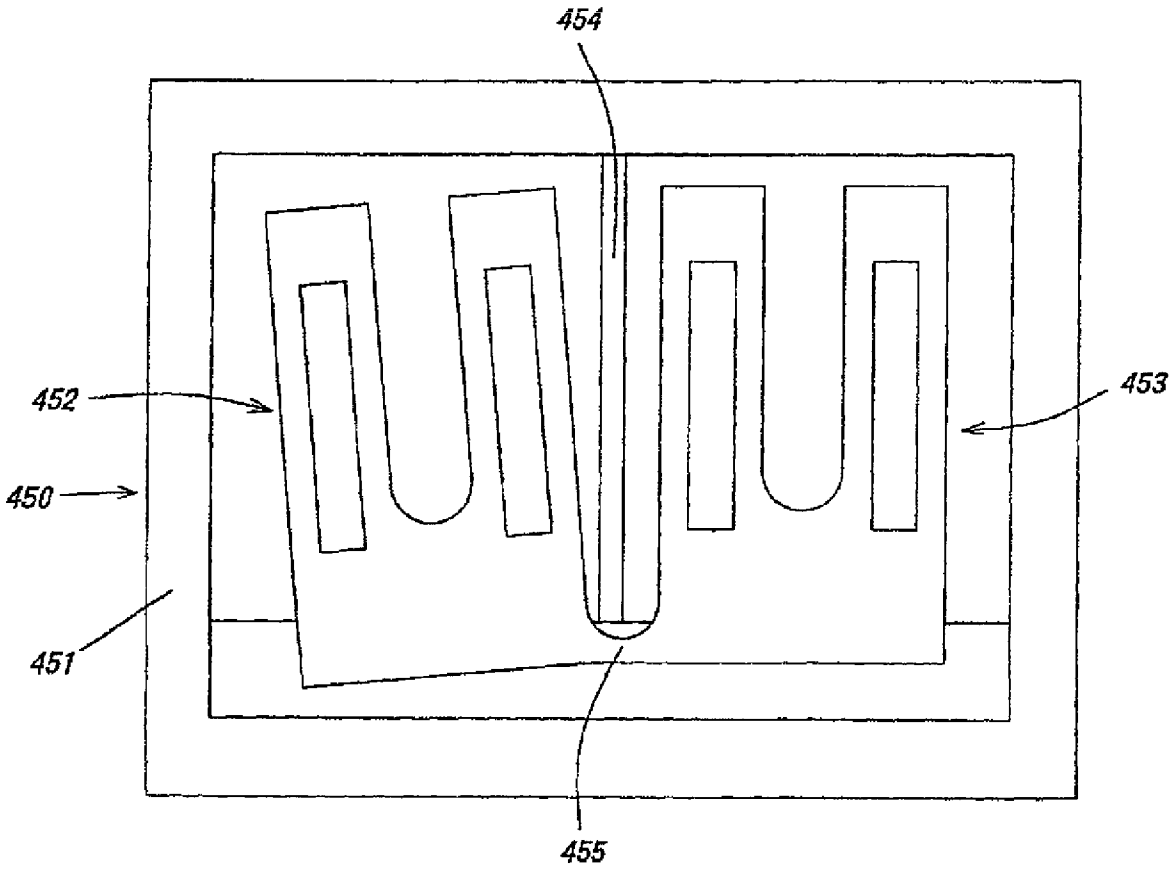
FIG. 26 shows a plan view of a quartz crystal unit of the twelfth embodiment of the present invention and omitting a lid, which has two flexural mode, tuning fork, quartz crystal resonators connected at each tuning bases via connecting portion and a dividing portion is constructed between the resonators.

FIG. 26 shows a plan view of a quartz crystal unit 450 of the twelfth embodiment of the present invention and omitting a lid. The quartz crystal unit 450 comprises a case 451, two flexural mode, tuning fork, quartz crystal resonators 452, 453 and a lid not shown in FIG. 26. The two resonators 452 and 453 each of which comprises tuning fork tines and tuning fork base, are connected at each tuning fork base via connecting portion 455 and formed integrally by an etching method, in more detail, by a chemical or physical or mechanical method. In this embodiment, a dividing portion 454 between both quartz crystal resonators 452 and 453 is constructed at the case 451 to prevent interference in vibration for the both resonators 452 and 453. Also, a height of the dividing portion 454 may be the same one as the case 451 or may be lower than that of the case 451. Moreover, the quartz crystal resonators 452 and 453 have the same grooves and electrodes as those of the tuning fork, quartz crystal resonator 21 described in FIG. 2, respectively.

In this embodiment, also, though the dividing portion 454 is constructed at the case 451 to prevent the interference in vibration for two flexural mode, tuning fork, quartz crystal resonators 452 and 453, the interference in vibration for both resonators 452 and 453 can be prevented by constructing a dividing portion between the both resonators 452 and 453, formed integrally with them. In addition, the construction of grooves and electrodes in this embodiment is not shown in FIG. 26, but it is same as that of FIG. 23.

In FIGS. 23 and 26, two flexural mode, tuning fork, quartz crystal resonators formed integrally are housed in a case of a quartz crystal unit, each of which has the same grooves and electrodes as those of the flexural mode, tuning fork, quartz crystal resonator housed in the case 2 of the quartz crystal unit shown in FIG. 1, but, instead of said resonators the flexural mode, tuning fork, quartz crystal resonators shown in FIGS. 5-22 may be housed in the case of the quartz crystal unit. In more detail, the same-designed resonators may be housed in the case or the different-designed resonators may be housed in the case. In addition, the same effect as that described in FIG. 25 can be also obtained by using at least one of two resonators, which is the flexural mode, tuning fork, quartz crystal resonator of the present invention shown in FIGS. 2-22.

Namely, by electrically connecting two flexural mode, tuning fork, quartz crystal resonators in parallel, a quartz crystal unit can be obtained with a small frequency change versus temperature because an improvement of frequency temperature behaviour can be performed, and simultaneously, when two pieces of quartz crystal resonators with the same series resistance $R_1$ are used, a compound quartz crystal resonator formed from embodiments of the present invention has about half the series resistance $R_1$. Thus, a quartz crystal unit with flexural mode, tuning fork, quartz crystal resonators can be realized with a small series resistance.

Next, a method of manufacturing a quartz crystal unit of the present invention is described in detail, according to the manufacturing steps.

Figure 27:
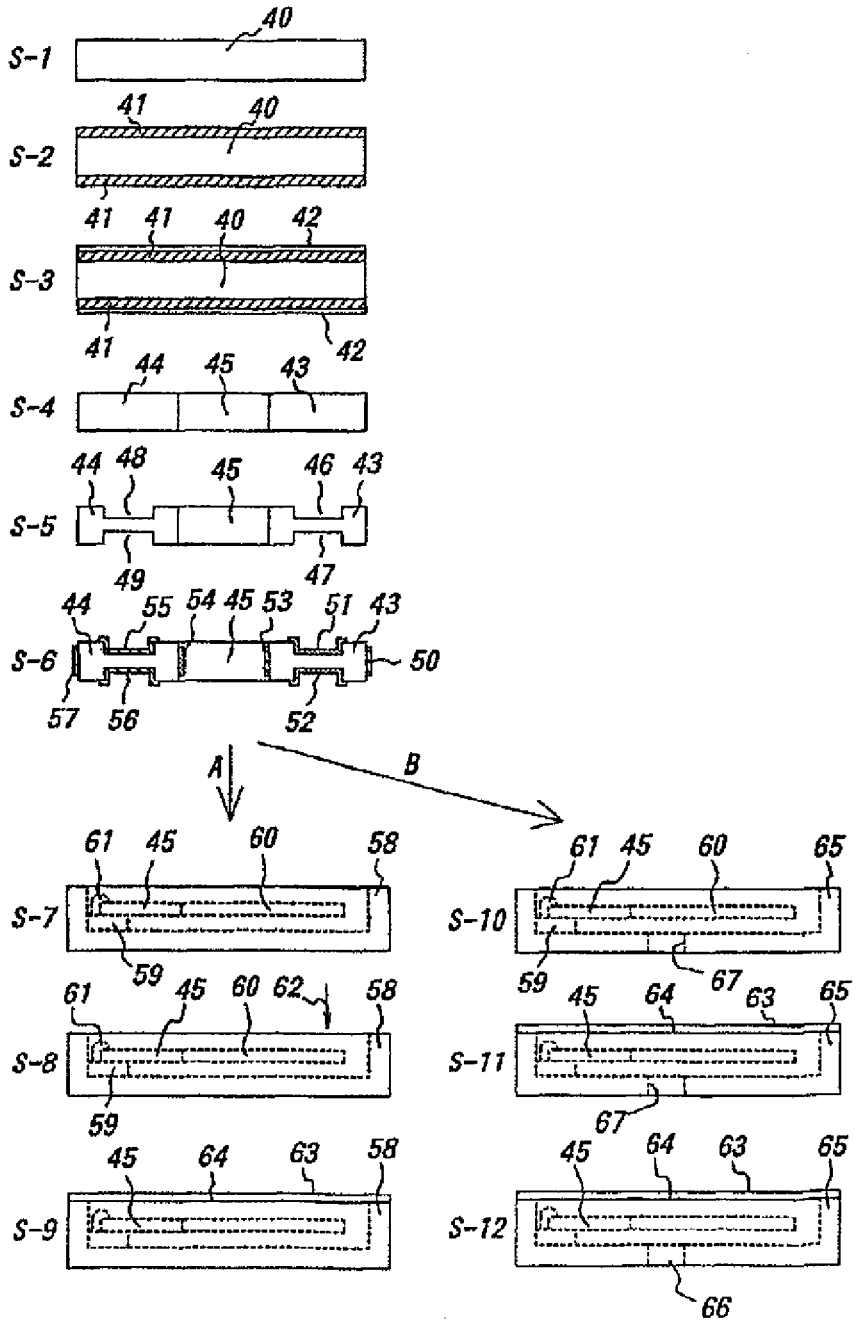
FIG. 27 shows a step diagram of a method for manufacturing a quartz crystal unit of the present invention.
Figure 28A:
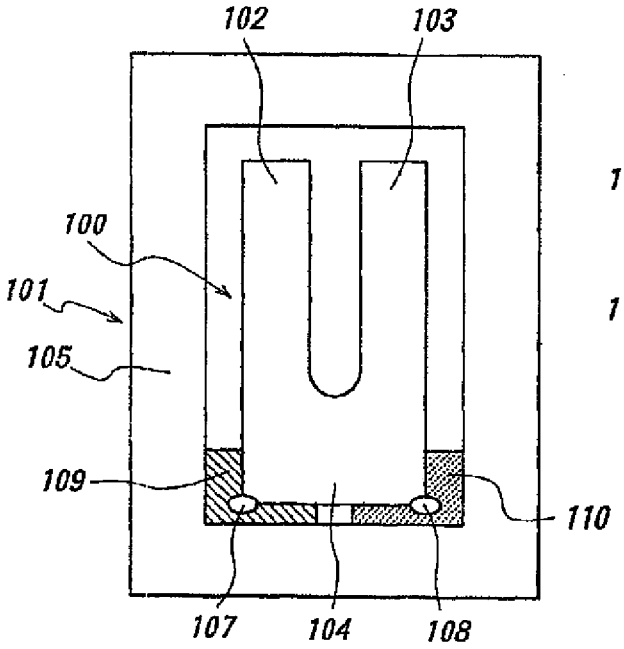
FIG. 28(a) and FIG. 28(b) are a plan view and a side view of the conventional quartz crystal unit.
Figure 28B:
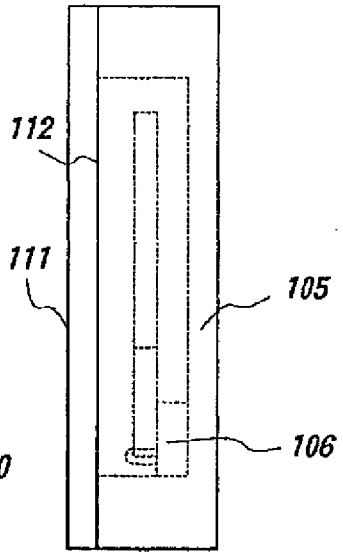
Figure 29:
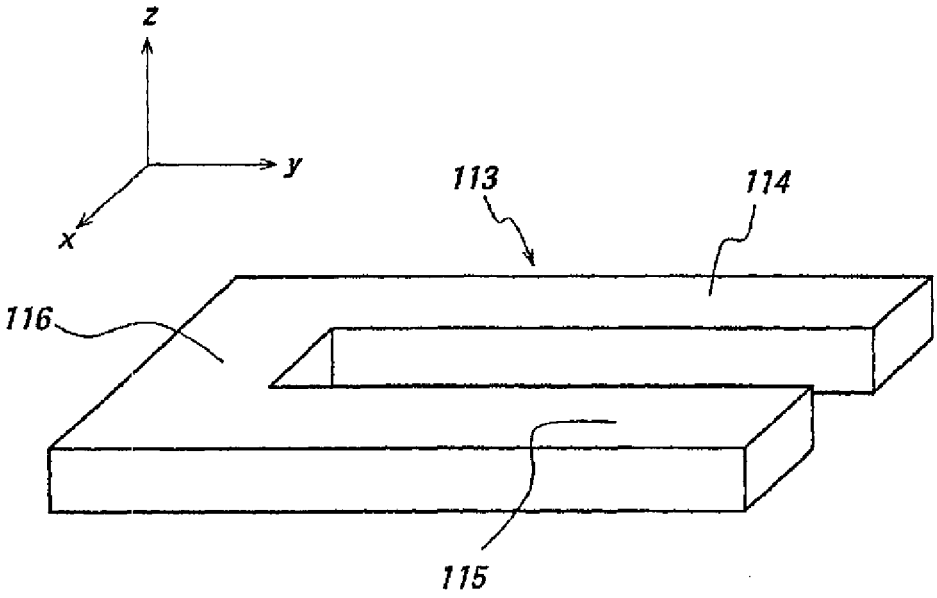
FIG. 29 is a general view of the conventional flexural mode, tuning fork, quartz crystal resonator constructing the quartz crystal unit of the prior art.
Figure 30:
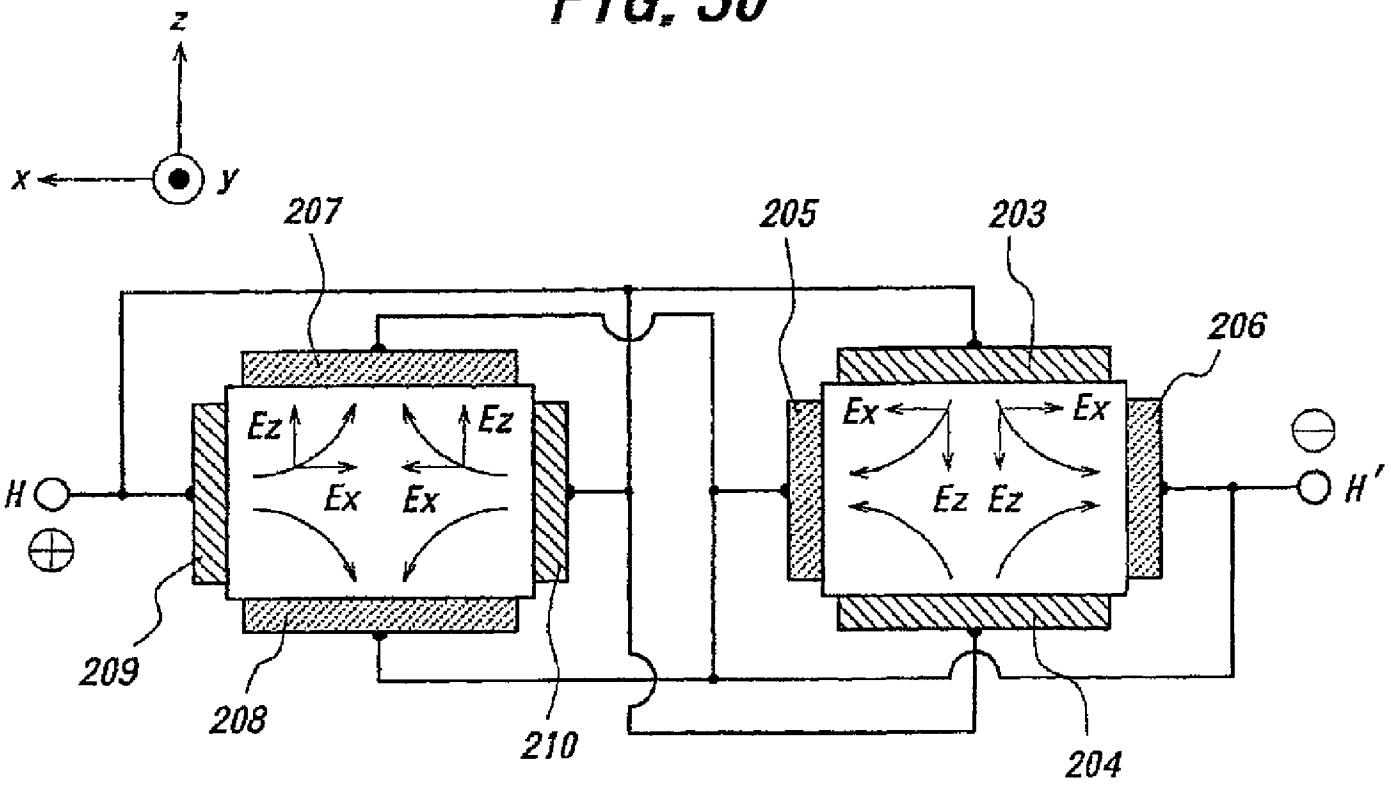
FIG. 30 is a cross-sectional view of the tuning fork tines of FIG. 29 and illustrating electrode construction.

FIG. 27 shows an embodiment of a method of manufacturing a quartz crystal unit of the present invention and a step diagram embodying the present invention. The signs of S-1 to S-12 are the step numbers. First, S-1 shows a cross-sectional view of a quartz crystal wafer 40. Next, in S-2 a (*first*) metal film 41 comprising chromium and gold, namely, chromium and gold on the chromium are, respectively, disposed on upper and lower faces of the quartz crystal wafer 40 by an evaporation method or a spattering method. In addition, *a*

(*first*) resist 42 is spread on [said] *the* metal film 41 in S-3, and after the metal film 41 and the resist 42 [were] *are* removed except those of *a* tuning fork shape by a photo-lithographic process and an etching process, the tuning fork shape with tuning fork tines 43,44 and a tuning *fork* base 45, as be shown in S-4, is integrally formed by a chemical etching process, *namely, in a first etching process*. In FIG. 27 the formation of a piece of tuning fork shape is shown, but, a number of tuning fork shapes are actually formed in a piece of quartz crystal wafer.

Similar to the steps of S-2 and S-3, [the] *a* (*second*) metal film and *a* (*second*) resist are spread again on the tuning fork shape of S-4 and grooves 46, 47, 48 and 49 each of which has two step difference portions *i.e., two stepped portions including a first stepped portion and a second stepped portion opposite the first stepped portion in the width direction* along the length direction of the tuning fork tines, are formed [at] *in two of main surfaces* (*e.g., in first and second opposite main surfaces*) *of each of* the tuning fork tines 43, 44 by [the] *a* photo-lithographic process and [the] *an* etching process, and the shape of S-5 is obtained after all of the resist and the metal film [were] *are* removed. *Thus, at least one of the grooves 46, 47, 48 and 49 is formed after the tuning fork tines 143, 144 are formed. Namely, at least one of the grooves 46, 47 of the tuning fork tine 43 is formed after the tuning fork tine 43 is formed, and at least one of the grooves 48, 49 of the tuning fork tine 44 is formed after the tuning fork tine 44 is formed. In other words, the step of forming the tuning fork tines 43, 44 is performed before the step of forming the groove formed in each of two of the main surfaces* (*e.g., in each of the first and second opposite main surfaces*) *of each of the tuning fork tines 43, 44.* In addition, *a* (*third or second*) metal film and *a* (*third or second*) resist are spread again on the shape of [S-5] *S-5, namely, the metal film is disposed on each of the first and second opposite main surfaces and first and second opposite side surfaces of each of the tuning fork tines 43, 44, and a surface of the groove formed in each of the first and second opposite main surfaces of each of the tuning fork tines 43, 44 and the resist is disposed on the metal film,* and electrodes which are of opposite electrical polarity, are disposed on [sides] *the first and second opposite side surfaces* of the tuning fork tines *43, 44* and inside the grooves thereof, as be shown in S-6. *As the result, a quartz crystal tuning fork resonator capable of vibrating in a flexural mode is obtained. In addition, the resist disposed on the metal film is removed before the step of mounting the quartz crystal tuning fork resonator on a mounting portion in an interior space of a case, as be shown in S-6.*

Namely, electrodes 50, 53 disposed on the [sides] *first and second opposite side surfaces* of the tuning fork tine 43 and electrodes 55, 56 disposed inside the grooves 48, 49 *i.e., on surfaces or on the first and second stepped portions of the grooves 48, 49* of the tuning fork tine 44 have the same electrical polarity. Similarly, electrodes 51, 52 disposed inside the grooves 46, 47 *i.e., on surfaces or the first and second stepped portions of the grooves 46, 47* of the tuning fork tine 43 and electrodes 54, 57 disposed on the [sides] *first and second side surfaces* of the tuning fork tine 44 have the same electrical polarity. *In addition, each of the electrodes 51, 52, 55 and 56 extends on a surface in the width direction adjoining the groove, namely, an electrode is disposed on the surface which is one of the first and second opposite main surfaces. In other words, the electrodes 50, 53 disposed on the first and second opposite side surfaces of the tuning fork tine 43 are connected to the electrodes 55, 56 disposed on the first and second stepped portions of the grooves formed in the first and second opposite main surfaces of the tuning fork tine 44 and the electrode disposed on each of the first and second opposite main surfaces of the tuning fork tine 44 to form a first electrode terminal, and the electrodes 54, 57 disposed on the first and second opposite side surfaces of the tuning fork tine 44 are connected to the electrodes 51, 52 disposed on the first and second stepped portions of the grooves formed in the first and second opposite main surfaces of the tuning fork tine 43 and the electrode disposed on each of the first and second opposite main surfaces of the tuning fork tine 43 to form a second electrode terminal.* Two electrode terminals are, therefore, constructed. In more detail, when an alternating current (AC) voltage is applied between the *two electrode* terminals, the tuning fork tines are capable of vibrating in *a* flexural mode in *of an* inverse phase because said electrodes disposed on [step difference] *the stepped* portions of the grooves and the electrodes disposed opposite to the said electrodes have opposite electrical polarity. In the step of S-6, a piece of [tuning fork] quartz crystal *tuning fork* resonator which is capable of vibrating in *a* flexural mode is shown in [a] *the* quartz crystal wafer, but a number of [tuning fork] quartz crystal *tuning fork* resonators are actually formed in the quartz crystal wafer. In addition, *a* resonance frequency [for said] *of each of the quartz crystal tuning fork* resonators is adjusted at least twice and at least once of the at least twice adjustment of *the* resonance frequency [for said] *of each of the quartz crystal tuning fork* resonators is performed in the quartz crystal wafer by *a* laser *method* or *an* evaporation *method* or *a* plasma etching method[, such] *so* that the resonance frequency [for said] *of each of the quartz crystal tuning fork* resonators is within a range of −9000 ppm to +5000 ppm (parts per million) to a nominal frequency that is within a range of 10 kHz to 200 kHz. The adjustment of frequency by *the* laser *method* or *the* plasma etching method is performed by trimming *a* mass disposed on *the* tuning fork tines and the adjustment of frequency by [an] *the* evaporation method is performed by adding *a* mass on *the* tuning fork tines. Namely, *by* those methods [can change] the resonance frequency of [said resonators] *each of the quartz crystal tuning fork resonators can be changed.*

In this embodiment, the tuning fork shape is formed from the step of S-3 and after that, the grooves are formed at the tuning fork tines, *namely, the tuning fork tines 43, 44 are formed before the grooves 46, 47, 48 and 49 of the tuning fork tines 43, 44 are formed, In other words, the step of forming the tuning fork tines 43, 44 is performed before the step of forming the groove formed in each of two of the main surfaces* (*e.g., in each of the first and second opposite main surfaces*) *of each of the tuning fork tines 43, 44,* but this invention is not limited to [said embodiment, for example, the] *such embodiment. For example, the* grooves *46, 47, 48 and 49* are first formed from the step of S-3 and after that, the tuning fork shape *having the tuning fork tines 43, 44 and the tuning fork base 45* may be formed, *namely, the grooves 46, 47, 48 and 49 are formed before the tuning fork tines 43, 44 are formed. In more detail, a plurality of grooves 46, 47, 48 and 49 are formed in first and second opposite surfaces of the quartz crystal wafer and after that, the tuning fork tines 43, 43 are formed so that a groove is located in each of the first and second opposite main surfaces of each of the tuning fork tines 43, 44. In other words, the step of forming the grooves 46, 47, 48 and 49 in the first and second opposite surfaces of the quartz crystal wafer is performed before the step of forming the tuning fork tines 43, 44 so that the groove is located in each of the first and second opposite main surfaces of each of the tuning fork tines 43, 44* or the tuning fork shape *having the tuning fork tines 43, 44 and the tuning fork base 45* and the grooves *46, 47, 48 and 49* may be formed at the same time[.],

*namely, the tuning fork tines 43, 44 are formed simultaneously with the grooves 46, 47, 48 and 49 formed in the first and second opposite main surfaces of each of the tuning fork tines 43, 44.* In addition, the grooves each of which has two [step difference] *stepped* portions along the direction of length of the tuning fork tines[,] are formed in this embodiment, but, instead of the grooves, [step difference] *stepped* portions and medium surface portions may be formed.

There are two methods of A and B in the following step, as be shown by arrow signs. For the step of A the tuning fork base 45 of the formed flexural mode, tuning fork, quartz crystal resonator 60 is first fixed on *a* mounting portion 59 *in an interior space* of a case 58 by conductive adhesives 61 or solder, as be shown in S-7. Second, the second adjustment of *the* resonance frequency for the resonator 60 is performed by *a* laser *method* 62 or *an* evaporation *method* or *a* plasma etching method in S-8[, such] *so* that the resonance frequency is within a range of −100 ppm to +100 ppm *to* the nominal frequency. Finally, the case 58 and lid 63 are connected via *a* glass 64 with the low melting point or a metal in S-9. In this case, the connection of the case and the lid is performed in *a* vacuum to obtain good electrical characteristics because the case 58 has no hole to close it in *a* vacuum. Additionally, though it is not visible in FIG. 27, the third adjustment of *the* resonance frequency may be performed by *using a* laser after the step of the connection of S-9 to get a small frequency deviation to the nominal frequency. As a result of which it is possible to get the resonance frequency within a range of −30 ppm to +30 ppm to the nominal frequency. In general, the nominal frequency is less than 200 kHz, *and* especially, 32.768 kHz is widely used in communication equipment as a time standard.

For the step of B the tuning fork base 45 of the formed flexural mode, tuning fork, quartz crystal resonator 60 is first fixed on *a* mounting portion 59 *in an interior space* of a case 65 by conductive adhesives 61 or solder in S-10, Second, in S-11 the case 65 and lid 63 are connected by the same way as that of S-9 and the second adjustment of *the* resonance frequency is performed in *a* vacuum or in *a* nitrogen gas[, such] *so* that the resonance frequency is within a range of −50 ppm to +50 ppm to the nominal frequency. Finally, a *through* hole 67 constructed at the case 65 is closed in *a* vacuum using such a metal 66 as solder or *a* glass with the low melting point in S-12. Also, similar to the step of A, the third adjustment of *the* resonance frequency may be performed by *using a* laser after the step of S-12 to get a small frequency deviation to the nominal frequency. As a result of which it is possible to get the resonance frequency within a range of −30 ppm to +30 ppm to the nominal frequency. In this embodiment, the second adjustment of *the* resonance frequency is performed before the hole is closed in vacuum, but may be performed after the hole [was] *is* closed in vacuum. Also, the hole is constructed at the case, but may be constructed at the lid.

In this embodiment, a method of manufacturing a quartz crystal unit with a piece of flexural mode, tuning fork, quartz crystal resonator is described in detail, but a quartz crystal unit with a plurality of individual flexural mode, tuning fork, quartz crystal resonators is also manufactured similar to the above-described steps.

Namely, a plurality of individual tuning fork shapes with tuning fork tines and tuning fork base which are connected at each tuning fork base via a connecting portion, are formed from the step of S-3 (S-4), in addition, grooves are formed at each tuning fork tine or at each tuning fork tine and each tuning fork base in S-5 and electrodes disposed on a plurality of individual flexural mode, tuning fork, quartz crystal resonators each of which is capable of vibrating in inverse phase, are constructed so that the tuning fork, quartz crystal resonators are electrically connected in parallel in S-6, and after that, the quartz crystal unit of the present invention is accomplished by the steps of A (S-7 to S-9) or B (S-10 to S-12). In order to get a small frequency difference of between at least two tuning fork, quartz crystal resonators, further frequency adjustment for the resonators may be performed by laser after the step of S-9 or S-12.

Therefore, the quartz crystal units of the present invention manufactured by the above-described method are miniaturized and realized with a small series resistance R1, a high quality factor Q and low price.

In addition, *each of* the flexural mode, tuning fork, quartz crystal resonators shown in FIGS. 1, 5, 7, 8, 9. 19 and 21 embodying the present invention [have] *has* two [pieces] *sets* of [step difference portion] *stepped portions each of which confronts each other* as a groove [(comprising generally, four step difference portions), each of which faces each other] *comprising four stepped portions*. In more detail, the [rectangular] grooves *each of which has a rectangular shape in plan view* are [shown in the plan views,] *shown,* but this invention is not limited to this, for example, this invention also includes a shape with at least two [step difference] *stepped* portions.

Likewise, in the present embodiments a flexural mode quartz crystal resonator of tuning fork type has two tuning fork tines, but embodiments of the present invention include a plurality of tuning fork tines. Embodiments of the present invention also include flexural mode, tuning fork, quartz crystal resonators which are connected and formed integrally at the tuning fork bases consisting of more than three component pieces of tuning fork, quartz crystal resonator. Also, embodiments of the present invention include the teaching that each resonator consisting of a plurality of flexural mode, tuning fork, quartz crystal resonators which are connected and formed integrally at each tuning fork base, which may have different resonator shapes and different electrode depositions.

Moreover, in the embodiments of the quartz crystal units of the present invention shown in FIGS. 23 and 26, an angle $\phi$ is constructed between two flexural mode, tuning fork, quartz crystal resonators to get the two resonators with different frequency temperature behaviour. Instead of the angle $\phi$, it is also possible to obtain two tuning fork, quartz crystal resonators with different frequency temperature behaviour by designing the two resonators with different dimensions. As a result of which the respective resonators can be obtained with different peak temperature point.

In addition, though integrally formed two flexural mode, tuning fork, quartz crystal resonators are housed in the case of the quartz crystal units in the embodiments of FIGS. 23 and 26, this invention is not limited to this, but also includes integrally formed tuning fork, quartz crystal resonators more than three.

Also, each flexural mode quartz crystal resonator is connected and formed integrally side by side via a connecting portion in the present embodiments as shown in FIGS. 23 and 26. However, the present invention is not limited to flexural mode, tuning fork, quartz crystal resonator connected and formed integrally side by side via a connecting portion, but includes the connection and integrated formation of any shapes at the tuning fork bases. In other words, the present invention includes integrally formed tuning fork, quartz crystal resonators with any shapes connected and formed integrally via connecting portion at each tuning fork base for a plurality of tuning fork, quartz crystal resonators.

Furthermore, though the quartz crystal units of FIGS. 23 and 26 embodying the present invention have integrally formed two flexural mode, tuning fork, quartz crystal resonators, respectively, the quartz crystal units of the present invention are not limited to these, but, may have at least one flexural mode, tuning fork, quartz crystal resonator. That is to say, at least one BAW (Bulk Acoustic Wave) resonator with vibration mode different from flexural mode or at least one SAW (Surface Acoustic Wave) resonator or at least one filter or at least one oscillator may be housed with said at least one tuning fork, quartz crystal resonator in a case of the present invention. For example, flexural mode, tuning fork, quartz crystal resonator and thickness shear mode quartz crystal resonator or width-extensional mode quartz crystal resonator or Lame mode quartz crystal resonator or torsional mode quartz crystal resonator or MCF filter or SAW filter or TCXO (Temperature Compensated Crystal Oscillator) or VCXO (Voltage Controlled Crystal Oscillator) or XO (Crystal Oscillator). The above-described resonators and filters are generally formed from such a piezoelectric material as quartz crystal, and also formed by a chemical or mechanical or physical etching method.

Furthermore, two flexural mode, tuning fork, quartz crystal resonators are connected and formed integrally with an angle of $\phi$ at each tuning fork base as shown in the embodiment of FIG. 23, and also embodiments of the present invention include the following flexural mode, tuning fork, quartz crystal resonator which has the same effect as said resonators with an angle of $\phi$, namely, the tuning fork bases of the plurality of the flexural mode, tuning fork, quartz crystal resonators are formed in parallel and one of the plurality of component resonators is at least designed and formed so that two tuning fork tines turn to the inside with an angle of $\phi$ or turn to the outside with an angle of $\phi$. It is needless to say that these resonators are connected and formed integrally at the tuning fork bases via connecting portion.

As mentioned above, by providing a quartz crystal unit with at least one flexural mode, tuning fork, quartz crystal resonator with the resonator shape and the electrode construction in embodiments of the present invention and its manufacturing method, the outstanding effects may be obtained as follow:

(1) As the grooves consisting of at least four step difference portions are constructed including a portion of the central line of the tuning fork tines, an electric field occurs perpendicular to the electrodes, so that a flexural mode, tuning fork, quartz crystal resonator with a small series resistance $R_1$ and a high quality factor Q is obtained because the electromechanical transformation efficiency becomes large. A quartz crystal unit is, therefore, obtained with good characteristics of the resonator.

(2) A flexural mode, tuning fork, quartz crystal resonator is obtained with a small series resistance $R_1$, even if it is miniaturized. Therefore, a miniaturized quartz crystal unit can be obtained because the miniaturized tuning fork, quartz crystal resonator is housed in a case.

(3) As two flexural mode, tuning fork, quartz crystal resonators are formed integrally by an etching process and are connected in parallel electrically, a quartz crystal unit with an integrally formed and miniaturized quartz crystal resonator can be realized with excellent frequency temperature behaviour.

(4) A low price quartz crystal resonator can be realized because a quartz crystal resonator is formed integrally by an etching process which makes it possible to form many resonators on a piece of quartz wafer. As a result of which a low priced quartz crystal unit can be also realized because the resonator is housed in a case.

(5) As the prior art quartz crystal resonators are based on the tuning fork type, it is easy to fix the flexural mode, tuning fork, quartz crystal resonators on a mounting portion of a quartz crystal unit. As a result, energy losses at fixing caused by the vibration of tuning fork tines decrease and quartz crystal units with the resonators obtained are shock resistant.

(6) As there is a plurality of grooves on the tuning fork base and electrodes of opposite polarities are disposed opposite the sides of adjoining grooves, the distortion at the tuning fork base is markedly large, so that a quartz crystal unit with a miniaturized flexural mode quartz crystal resonator of tuning fork type is obtained with a small series resistance $R_1$ and a high quality factor Q.

(7) As grooves are constructed including the central line of tuning fork tine, and electrodes are disposed on said grooves and said grooves extend to tuning fork base, the quantity of distortion at the tuning fork base becomes remarkably large. Therefore, a quartz crystal unit with a miniaturized flexural mode, tuning fork, quartz crystal resonator is obtained with a small series resistance $R_1$ and a high quality factor Q because the electromechanical transformation efficiency gets large.

(8) As electrodes are disposed on step difference portions constructed at the obverse and the reverse faces of tuning fork tines along the length direction thereof and the sides of the tuning fork tines opposite said electrodes have electrodes of opposite polarity to said electrodes, the electromechanical transformation efficiency becomes very large. As a result, a flexural mode, tuning fork, quartz crystal resonator can be realized with a small series resistance $R_1$ and a high quality factor Q and also, a quartz crystal unit with said resonator is obtained with a high quality.

(9) A markedly narrow width tuning fork tines can be obtained maintaining sufficiently large electromechanical transformation efficiency because the step difference is constructed on the tuning fork tines. As a result of which, a quartz crystal unit with a miniaturized quartz crystal resonator can be obtained.

(10) As a plurality of flexural mode, tuning fork, quartz crystal resonators are formed integrally and connected in parallel electrically, the compound series resistance $R_1$ for the compound resonator becomes small. For example, when two pieces of resonator with the same series resistance $R_1$ are used, a compound resonator formed from embodiments of the present invention have about half the series resistance $R_1$. Therefore, a compound series resistance $R_1$ can be decreased still more by increasing the number of resonators which are formed integrally. Namely, a quartz crystal unit with small series resistance $R_1$ can be realized by housing a plurality of resonators in a case.

(11) As a quartz crystal unit has a plurality of flexural mode, tuning fork, quartz crystal resonators which are formed integrally, and connected in parallel electrically, the function can be maintained as a quartz crystal unit, even if one of the plurality of resonators is broken by some cause, for example, by shock.

(12) As grooves are constructed including the central line of tuning fork tine, and electrodes are disposed on said grooves and said grooves extend to tuning fork base, in addition, as further grooves are constructed between the extending grooves, the quantity of distortion at the tuning fork base becomes remarkably large. Therefore, a quartz crystal unit with a miniaturized flexural mode, tuning fork, quartz crystal resonator is obtained with a small series resistance $R_1$ and a high quality factor Q because the electromechanical transformation efficiency gets large.

(13) As electrodes are disposed on step difference portions constructed at the obverse and the reverse faces of tuning fork tines along the length direction thereof and the sides of the tuning fork tines opposite said electrodes have electrodes of opposite polarity to said electrodes, in addition, as said step difference portions extend to tuning fork base and further grooves are constructed between the extending step difference portions, the electromechanical transformation efficiency becomes very large because the quantity of distortion at the tuning fork base becomes remarkably large. As a result, a flexural mode, tuning fork, quartz crystal resonator can be realized with a small series resistance $R_1$ and a high quality factor Q and also, a quartz crystal unit with said resonator is obtained with a high quality.

(14) As a miniaturized flexural mode, tuning fork, quartz crystal resonator is housed in a case of a quartz crystal unit, a light quartz crystal unit can be obtained.

(15) A low price quartz crystal unit can be realized because a method for manufacturing a quartz crystal unit is very simple and the manufacturing steps decrease.

(16) A quartz crystal unit with high reliability can be obtained because ceramics or glass is used as a material of case and metal or glass is used as a material of lid.

(17) As a plurality of flexural mode, tuning fork, quartz crystal resonators are not housed in a case of an individual quartz crystal unit, but, housed in a case of the same unit, a low price quartz crystal unit can be realized and simultaneously, a quartz crystal unit with excellent frequency temperature behaviour is obtained by electrically connecting these resonators in parallel.

(18) A quartz crystal unit is obtained with a small frequency deviation because resonance frequency for a flexural mode, tuning fork, quartz crystal resonator is adjusted by laser after the resonator housed in a case was closed in vacuum. (19) By showing a relationship of a groove and a dimension for a flexural mode, tuning fork, quartz crystal resonator, a miniaturized flexural mode, tuning fork, quartz crystal resonator which vibrates very easily in a fundamental mode with suppression of the second and the third overtone modes which are unwanted vibration modes, can be obtained with a small series resistance $R_1$ and a high quality factor Q. As a result of which a miniturized quartz crystal unit can be also obtained with a high quality.

(20) By constructing the electrodes and the step portions to connect step difference portions constructed along the direction of length of the tuning fork tines, a quartz crystal unit with a tuning fork, quartz crystal resonator capable of vibrating in fundamental mode very easily can be obtained with a small series resistance $R_1$ and a high quality factor Q because the quantity of charges which generate on the step difference portions and the side faces of the tuning fork tines can be controlled and the second and third overtone modes for the resonator which are unwanted vibration modes can be substantially suppressed in vibration.

As described above, it will be easily understood that the quartz crystal units with at least one flexural mode, tuning fork, quartz crystal resonator with novel shapes and the novel electrode construction according to the present invention may have the same outstanding effects. In addition to this, while the present invention has been shown and described with reference to preferred embodiments thereof, it will be understood by those skilled in the art that the changes in shape and electrode construction can be made therein without departing from the spirit and scope of the present invention.

What is claimed is:

[1. A method for manufacturing a quartz crystal unit, comprising the steps of:

forming at least one quartz crystal tuning fork resonator by etching a quartz crystal wafer to form a quartz crystal tuning fork base, a plurality of quartz crystal tuning fork tines connected to the quartz crystal tuning fork base, and at least one groove having a plurality of stepped portions in at least one of opposite main surfaces of each of the quartz crystal tuning fork tines, and disposing a first electrode on at least one of the stepped portions of at least one of the grooves and a second electrode on at least one side surface of each of the quartz crystal tuning fork tines;

adjusting at least twice and in different steps a frequency of oscillation of the quartz crystal tuning fork resonator;

providing a case having an interior space and an open end communicating with the interior space;

providing a lid for covering the open end of the case;

mounting the quartz crystal tuning fork resonator in the interior space of the case; and connecting the lid to the case to cover the open end thereof.]

[2. A method according to claim 1; wherein the step of forming the groove comprises the step of forming a through-hole in each of the quartz crystal tuning fork tines extending through the opposite main surfaces thereof.]

[3. A method according to claim 1; wherein the step of forming a plurality of quartz crystal tuning fork tines comprises the step of forming a first quartz crystal tuning fork tine and a second quartz crystal tuning fork tine; wherein the step of forming the first and second electrodes comprises the steps of forming the first electrode on each of two of the stepped portions of the groove in at least one of the opposite main surfaces of each of the first and second quartz crystal tuning fork tines and forming the second electrode on each of two of the side surfaces of each of the first and second quartz crystal tuning fork tines; and wherein the first electrode disposed on each of two of the stepped portions of the groove of the first quartz crystal tuning fork tine is connected to the second electrode disposed on each of two of the side surfaces of the second quartz crystal tuning fork tine to form a first electrode terminal, and the second electrode disposed on each of two of the side surfaces of the first quartz crystal tuning fork tine is connected to the first electrode disposed on each of two of the stepped portions of the groove of the second quartz crystal tuning fork tine to form a second electrode terminal so that the quartz crystal tuning fork resonator vibrates in a flexural mode of an inverse phase when an alternating current voltage is applied between the first electrode terminal and the second electrode terminal.]

[4. A method according to claim 3; wherein the at least one groove is formed in each of the first main surface and the second main surface of each of the quartz crystal tuning fork tines so that a ratio $W_2/W$ is in the range of 0.35 to 0.85, where $W_2$ represents a width of the groove and W represents a width of each of the quartz crystal tuning fork tines.]

[5. A method according to claim 3; wherein the adjusting step comprises the step of adjusting the frequency of oscillation of the quartz crystal tuning fork resonator by at least one of a laser method and evaporation and etching methods so that the frequency of oscillation of the quartz crystal tuning fork resonator is about 32.768 Hz with a frequency deviation within the range of −9000 PPM to +5000 PPM.]

[6. A method according to claim 3; wherein the side surfaces of the first and second quartz crystal tuning fork tines comprise a first side surface and a second side surface, the first side surface of the first quartz crystal tuning fork tine confronting the first side surface of the second quartz crystal tuning fork tine; and wherein the stepped portions of the groove comprises a first stepped portion, a second stepped portion, and a third stepped portion connecting the first stepped portion to the second stepped portion, each of the first and second stepped portions being formed opposite to the first side surface of each of the first and second quartz crystal tuning fork tines.]

[7. A method according to claim 3; wherein the step of forming at least one quartz crystal tuning fork resonator comprises the steps of forming two of the quartz crystal tuning fork resonators and integrally connecting together the two quartz crystal tuning fork resonators at their respective quartz crystal tuning fork bases at an angle of 30° or less.]

[8. A method according to claim 3; wherein the adjusting step comprises the step of adjusting the frequency of oscillation of the quartz crystal tuning fork resonator by at least one of a laser method and evaporation and etching methods after the quartz crystal tuning fork resonator is mounted in the interior space of the case so that the frequency of oscillation of the resonator is about 32.768 kHz with a frequency deviation within the range of −100 PPM to +100 PPM.]

[9. A method according to claim 8; wherein the step of forming at least one quartz crystal tuning fork resonator comprises the step of forming one quartz crystal tuning fork resonator capable of vibrating in a flexural mode of an inverse phase; and further comprising the step of forming one quartz crystal resonator capable of vibrating in a mode different from the flexural mode of an inverse phase.]

[10. A method according to claim 8; wherein the connecting step comprises the step of connecting the lid to the case using at least one of a metal and a glass with a low melting point.]

[11. A method according to claim 10; wherein the adjusting step comprises the step of adjusting the frequency of oscillation of the quartz crystal tuning fork resonator by a laser method after the connecting step so that the frequency of oscillation of the quartz crystal tuning fork resonator is about 32.768 kHz with a frequency deviation within the range of −30 ppm to +30 ppm.]

[12. A method according to claim 10; wherein the adjusting step comprises the step of adjusting the frequency of oscillation of the quartz crystal tuning fork resonator by a laser method after the connecting step so that the frequency of oscillation of the resonator is about 32.768 kHz with a frequency deviation within the range of −50 ppm to +50 ppm.]

[13. A method according to claim 12; wherein one of the case and the lid has a through-hole; and further comprising the step of disposing at least one of a metal and a glass into the through hole to maintain the interior space of the case in a vacuum.]

[14. A method according to claim 13; wherein the adjusting step comprises the step of adjusting the frequency of oscillation of the quartz crystal tuning fork resonator by a laser method after the disposing step so that the frequency of oscillation of the resonator is about 32.768 kHz with a frequency deviation within the range of −30 ppm to +30 ppm.]

[15. A method according to claim 3; wherein the forming step comprises the steps of forming the quartz crystal tuning fork tines in a first etching process and forming the corresponding grooves in a second etching process different from the first etching process; and wherein the step of forming the quartz crystal tuning fork tines is performed before the step of forming the corresponding grooves.]

[16. A method according to claim 3; wherein the forming step comprises the steps of forming the quartz crystal tuning fork tines in a first etching process and forming the corresponding grooves in a second etching process different from the first etching process; and wherein the step of forming the corresponding grooves is performed before the step of forming the quartz crystal tuning fork tines.]

[17. A method according to claim 1; wherein the adjusting step comprises the step of adjusting a frequency of oscillation of the quartz crystal tuning fork resonator to a preselected frequency with a frequency deviation within the range of −100 ppm to +100 ppm.]

[18. A method according to claim 17; wherein the preselected frequency is about 32.768 kHz.]

[19. A method according to claim 17; wherein a width of the groove formed in at least one of the opposite main surfaces of each of the quartz crystal tuning fork tines is greater than a distance in the width direction of the groove measured from an outer edge of the groove to an outer edge of the quartz crystal tuning fork tine.]

[20. A method according to claim 19; wherein the forming step comprises the steps of forming the quartz crystal tuning fork tines in a first etching process and forming the corresponding grooves in a second etching process different from the first etching process; and wherein the step of forming the quartz crystal tuning fork tines is performed before the step of forming the corresponding grooves.]

[21. A method according to claim 19; wherein the forming step comprises the steps of forming the quartz crystal tuning fork tines in a first etching process and forming the corresponding grooves in a second etching process different from the first etching process; and wherein the step of forming the corresponding grooves is performed before the step of forming the quartz crystal tuning fork tines.]

[22. A method according to claim 19; wherein the groove formed in at least one of the main surfaces of each of the quartz crystal tuning fork tines comprises a through hole.]

[23. A method according to claim 19; wherein the forming step comprises the steps of forming the quartz crystal tuning fork tines into a first quartz crystal tuning fork tine and a second quartz crystal tuning fork tine; forming a groove in each of opposite main surfaces of each of the first and second quartz crystal tuning fork tines; forming a first electrode on each of at least two of the stepped portions of the groove in each of the opposite main surfaces of the first and second quartz crystal tuning fork tines; forming a second electrode on each of two of side surfaces of each of the first and second quartz crystal tuning fork tines; connecting the first electrodes disposed on at least two of the stepped portions of the groove of the first quartz crystal tuning fork tine to the second electrodes disposed on two of the side surfaces of the second quartz crystal tuning fork tine to form a first electrode terminal; and connecting the second electrodes disposed on two of the side surfaces of the first quartz crystal tuning fork tine to the first electrodes disposed on at least two of the stepped portions of the groove of the second quartz crystal tuning fork tine to form a second electrode terminal; and further comprising the step of applying an alternating current voltage between the first electrode terminal and the second electrode terminal to vibrate the quartz crystal tuning fork resonator in a flexural mode of an inverse phase.]

[24. A method according to claim 23; wherein the forming step comprises the step of forming the first and second quartz crystal tuning fork tines simultaneously with the corresponding grooves.]

[25. A method according to claim 23; wherein a ratio $W_2/W$ is in the range of 0.35 to 0.85, where $W_2$ represents a width of the groove and W represents a width of each of the first and second quartz crystal tuning fork tines.]

[26. A method according to claim 25; wherein the connecting step comprises the step of connecting the lid to the case using at least one of a metal and a glass with a low melting point.]

[27. A method according to claim 25; wherein the quartz crystal tuning fork resonator has a fundamental mode of vibration and a second overtone mode of vibration; and wherein a series resistance $R_1$ of the fundamental mode of vibration is less than a series resistance $R_2$ of the second overtone mode of vibration.]

[28. A method according to claim 27; wherein one of the case and the lid has a through-hole; and further comprising the step of disposing at least one of a metal and a glass into the through-hole to maintain the interior space of the case in a vacuum.]

[29. A method according to claim 27; further comprising the step of providing a CMOS inverter, a plurality of capacitors, and a plurality of resistors to form an oscillator having the quartz crystal tuning fork resonator.]

[30. A method according to claim 1; wherein the adjusting step comprises the steps of adjusting a frequency of oscillation of the quartz crystal tuning fork resonator to a first preselected frequency of oscillation, and adjusting the frequency of oscillation of the quartz crystal tuning fork resonator to a second preselected frequency of oscillation different from the first preselected frequency of oscillation.]

[31. A method according to claim 30; wherein the first preselected frequency of oscillation is about 32.768 kHz with a frequency deviation within the range of −9000 ppm to +5000 ppm; and wherein the second preselected frequency of oscillation is about 32.768 kHz with a frequency deviation within the range of −100 ppm to +100 ppm.]

[32. A method according to claim 30; wherein the at least one groove is formed in each of the opposite main surfaces of each of the quartz crystal tuning fork tines so that a ratio $W_2/W$ is in the range of 0.35 to 0.85, where $W_2$ represents a width of the groove and W represents a width of each of the first and second quartz crystal tuning fork tines.]

[33. A method according to claim 30, further comprising the step of etching the quartz crystal wafer to simultaneously form the quartz crystal tuning fork tines and the corresponding grooves by a single etching process.]

[34. A method according to claim 30, wherein the quartz crystal tuning fork resonator has a fundamental mode of vibration and a second overtone mode of vibration; and wherein a series resistance $R_1$ of the fundamental mode of vibration is less than a series resistance $R_2$ of the second overtone mode of vibration.]

[35. A method according to claim 34; wherein the at least one groove is formed in each of the opposite main surfaces of each of the quartz crystal tuning fork tines so that a width of at least one of the grooves in each of the opposite main surfaces of each of the quartz crystal tuning fork tines is greater than a distance in the width direction of the groove measured from an outer edge of the groove to an outer edge of the quartz crystal tuning fork tine; and wherein the forming step comprises the steps of forming the quartz crystal tuning fork tines into a first quartz crystal tuning fork tine and a second quartz crystal tuning fork tine; forming at least one groove in each of opposite main surfaces of each of the first and second quartz crystal tuning fork tines; forming a plurality of first electrodes on at least two of the stepped portions of the grooves in the opposite main surfaces of the first and second quartz crystal tuning fork tines; forming a plurality of second electrodes on side surfaces of each of the first and second quartz crystal tuning fork tines; connecting the first electrodes disposed on at least two of the stepped portions of the grooves of the first quartz crystal tuning fork tine to the second electrodes disposed on the side surfaces of the second quartz crystal tuning fork tine to form a first electrode terminal; and connecting the second electrodes disposed on the side surfaces of the first quartz crystal tuning fork tine to the first electrodes disposed on at least two of the stepped portions of the grooves of the second quartz crystal tuning fork tine to form a second electrode terminal; and further comprising the step of applying an alternating current voltage between the first electrode terminal and the second electrode terminal to vibrate the quartz crystal tuning fork resonator in a flexural mode of an inverse phase.]

[36. A method according to claim 35; wherein the forming step comprises the steps of forming the quartz crystal tuning fork tines in a first etching process and forming the corresponding grooves in a second etching process different from the first etching process; and wherein the step of forming the quartz crystal tuning fork tines is performed before the step of forming the corresponding grooves.]

*37. A method for manufacturing a quartz crystal unit, comprising the steps of:*

*forming at least one quartz crystal tuning fork resonator having an overall length by etching a quartz crystal wafer to form a quartz crystal tuning fork base, a plurality of quartz crystal tuning fork tines connected to the quartz crystal tuning fork base, and at least one groove having a length and a plurality of stepped portions in at least one of opposite main surfaces of each of the quartz crystal tuning fork tines, and disposing a first electrode on at least one of the stepped portions of at least one of the grooves and a second electrode on at least one side surface of each of the quartz crystal tuning fork tines;*

*determining the overall length of the quartz crystal tuning fork resonator and the length of the at least one groove formed in the at least one of the opposite main surfaces of each of the quartz crystal tuning fork tines so that a series resistance $R_1$ of a fundamental mode of vibration of the quartz crystal tuning fork resonator is less than a series resistance $R_2$ of a second overtone mode of vibration thereof or less than a series resistance $R_3$ of a third overtone mode of vibration thereof;*

*adjusting at least twice and in different steps a frequency of oscillation of the quartz crystal tuning fork resonator;*

*providing a case having an interior space and an open end communicating with the interior space;*

*providing a lid for covering the open end of the case;*

*mounting the quartz crystal tuning fork resonator in the interior space of the case; and*

*connecting the lid to the case to cover the open end thereof.*

*38. A method according to claim 37; wherein each of the quartz crystal tuning fork tines has a length; wherein the stepped portions of the at least one groove formed in the at least one of the opposite main surfaces of at least one of the quartz crystal tuning fork tines comprise a first stepped portion, a second stepped portion and a third stepped portion, each of the first and second stepped portions being formed along the length of the at least one quartz crystal tuning fork tine and being formed directly opposite the at least one side surface of the at least one quartz crystal tuning fork tine so that the at least one groove formed in the at least one of the opposite main surfaces of the at least one quartz crystal tuning fork tine has a first width and a second width greater than the first width and the first stepped portion is not opposite the second stepped portion in the width direction, the third stepped portion being directly connected to each of the first and second stepped portions; and wherein each of the first and second widths of the at least one groove formed in the*

*at least one of the opposite main surfaces of the at least one quartz crystal tuning fork tine is greater than each of a first distance in the width direction of the at least one groove measured from a first outer edge of the first stepped portion of the at least one groove to a first outer edge of the at least one side surface of the at least one quartz crystal tuning fork tine and a second distance less than the first distance in the width direction of the at least one groove measured from a second outer edge of the second stepped portion of the at least one groove to a second outer edge of the at least one side surface of the at least one quartz crystal tuning fork tine.*

*39. A method according to claim 28; wherein the stepped portions of the at least one groove formed in the at least one of the opposite main surfaces of the at least one quartz crystal tuning fork tine comprise a fourth stepped portion opposite a fifth stepped portion in the length direction; wherein the fourth stepped portion is directly connected to the first stepped portion; wherein the fifth stepped portion is directly connected to the second stepped portion; wherein the quartz crystal tuning fork tines comprise first and second quartz crystal tuning fork tines, each of the first and second quartz crystal tuning fork tines having a first main surface and a second main surface opposite the first main surface; wherein the forming step of the at least one groove comprises the step of forming a groove having a length in at least one of the first and second main surfaces of each of the first and second quartz crystal tuning fork tines; and wherein the determining step comprises the step of determining each of the overall length of the quartz crystal tuning fork resonator and the length of the groove formed in the at least one of the first and second main surfaces of each of the first and second quartz crystal tuning fork tines so that the series resistance $R_1$ of the fundamental mode of vibration of the quartz crystal tuning fork resonator is less than the series resistance $R_2$ of the second overtone mode of vibration thereof or less than the series resistance $R_3$ of the third overtone mode of vibration thereof.*

*40. A method according to claim 37; wherein the adjusting step comprises the steps of adjusting the frequency of oscillation of the quartz crystal tuning fork resonator after the forming step of the at least one groove and before the mounting step so that the frequency of oscillation thereof comprises a first preselected frequency of oscillation, and adjusting the frequency of oscillation of the quartz crystal tuning fork resonator after the mounting step so that the frequency of oscillation thereof comprises a second frequency of oscillation.*

*41. A method according to claim 38; wherein the first preselected frequency of oscillation is about 32.768 kHz with a frequency deviation within a range of −9000 ppm to +5000 ppm; and wherein the second preselected frequency of oscillation is about 32.768 kHz with a frequency deviation within a range of −100 ppm to +100 ppm.*

*42. A method according to claim 37; wherein the quartz crystal tuning fork tines comprise first and second quartz crystal tuning fork tines, each of the first and second quartz crystal tuning fork tines having a length, and a first main surface and a second main surface opposite the first main surface, and a first side surface and a second side surface opposite the first side surface; wherein the forming step of the at least one groove comprises the step of forming a groove having a first width and a second width greater than the first width, and first, second and third stepped portions in at least one of the first and second main surfaces of each of the first and second quartz crystal tuning fork tines; wherein the case has a through-hole and a mounting portion in the interior space; wherein the mounting step comprises the step of mounting the quartz crystal tuning fork resonator on the mounting portion in the interior space of the case; and further comprising the sequential steps of forming a quartz crystal tuning fork shape having the quartz crystal tuning fork base, and the first and second quartz crystal tuning fork tines; forming the groove in the at least one of the first and second main surfaces of each of the first and second quartz crystal tuning fork tines so that each of the first and second stepped portions is formed along the length of the corresponding one of the first and second quartz crystal tuning fork tines and formed directly opposite the first side surface of the corresponding one of the first and second quartz crystal tuning fork tines, the third stepped portion being directly connected to each of the first and second stepped portions, and so that the first width of the groove formed in the at least one of the first and second main surfaces of each of the first and second quartz crystal tuning fork tines is greater than a first distance in the width direction of the groove measured from a first outer edge of the first stepped portion of the groove to a first outer edge of the first side surface of the corresponding one of the first and second quartz crystal tuning fork tines and the second width of the groove formed in the at least one of the first and second main surfaces of each of the first and second quartz crystal tuning fork tines is greater than a second distance less than the first distance in the width direction of the groove measured from a second outer edge of the second stepped portion of the groove to a second outer edge of the first side surface of the corresponding one of the first and second quartz crystal tuning fork tines; forming a first electrode on a surface of each of the first and second stepped portions of the groove formed in the at least one of the first and second main surfaces of each of the first and second quartz crystal tuning fork tines and a second electrode on each of the first and second side surfaces of each of the first and second quartz crystal tuning fork tines so that the first electrode formed on the surface of each of the first and second stepped portions of the groove formed in the at least one of the first and second main surfaces of the first quartz crystal tuning fork tine is connected to the second electrode formed on each of the first and second side surfaces of the second quartz crystal tuning fork tine, and the first electrode formed on the surface of each of the first and second stepped portions of the groove formed in the at least one of the first and second main surfaces of the second quartz crystal tuning fork tine is connected to the second electrode formed on each of the first and second side surfaces of the first quartz crystal tuning fork tine; adjusting the frequency of oscillation of the quartz crystal tuning fork resonator so that the frequency of oscillation thereof comprises a preselected frequency of oscillation; mounting the quartz crystal tuning fork resonator on the mounting portion in the interior space of the case; connecting the lid to the case to cover the open end thereof; and disposing a metal or a glass into the through-hole of the case to close the through-hole thereof in a vacuum.*

*43. A method according to claim 40; wherein the preselected frequency of oscillation is about 32.768 kHz with a frequency deviation within a range of −9000 ppm to +5000 ppm; and further comprising the step of adjusting the frequency of oscillation of the quartz crystal tuning fork resonator after the mounting step so that the frequency of oscillation thereof is about 32.768 kHz with a frequency deviation within a range of −50 ppm to +50 ppm.*

*44. A method according to claim 37; wherein the quartz crystal tuning fork tines comprise first and second quartz crystal tuning fork tines, each of the first and second quartz crystal tuning fork tines having a first main surface and a second main surface opposite the first main surface, and a first side surface and a second side surface opposite the first*

*side surface; wherein the forming step of the at least one groove comprises the step of forming a groove in at least one of the first and second main surfaces of each of the first and second quartz crystal tuning fork tines; wherein the case has a mounting portion in the interior space; wherein the mounting step comprises the step of mounting the quartz crystal tuning fork resonator on the mounting portion in the interior space of the case; and further comprising the sequential steps of forming a quartz crystal tuning fork shape having the quartz crystal tuning fork base, and the first and second quartz crystal tuning fork tines; forming the groove in the at least one of the first and second main surfaces of each of the first and second quartz crystal tuning fork tines; forming a metal film on each of the first and second side surfaces of each of the first and second quartz crystal tuning fork tines; forming a resist on the metal film; forming a first electrode on a surface of the groove formed in the at least one of the first and second main surfaces of each of the first and second quartz crystal tuning fork tines and a second electrode on each of the first and second side surfaces of each of the first and second quartz crystal tuning fork tines so that the first electrode formed on the surface of the groove formed in the at least one of the first and second main surfaces of the first quartz crystal tuning fork tine is connected to the second electrode formed on each of the first and second side surfaces of the second quartz crystal tuning fork tine, and the first electrode formed on the surface of the groove formed in the at least one of the first and second main surfaces of the second quartz crystal tuning fork tine is connected to the second electrode formed on each of the first and second side surfaces of the first quartz crystal tuning fork tine; removing the resist formed on the metal film; adjusting the frequency of oscillation of the quartz crystal tuning fork resonator so that the frequency of oscillation thereof is about 32.768 kHz with a frequency deviation within a range of −9000 ppm to +5000 ppm; mounting the quartz crystal tuning fork resonator on the mounting portion in the interior space of the case; adjusting the frequency of oscillation of the quartz crystal tuning fork resonator so that the frequency of oscillation thereof is about 32.768 kHz with a frequency deviation within a range of −100 ppm to +100 ppm; and connecting the lid to the case to cover the open end thereof.*

*45. A method according to claim 37; wherein the quartz crystal tuning fork tines comprise first and second quartz crystal tuning fork tines, each of the first and second quartz crystal tuning fork tines having a length, a first main surface and a second main surface opposite the first main surface, and a first side surface and a second side surface opposite the first side surface; wherein the forming step of the at least one groove comprises the step of forming a groove having a length, and first, second and third stepped portions in at least one of the first and second main surfaces of each of the first and second quartz crystal tuning fork tines so that each of the first and second stepped portions is formed along the length of the corresponding one of the first and second quartz crystal tuning fork tines and is formed directly opposite the first side surface of the corresponding one of the first and second quartz crystal tuning fork tines, the third stepped portion being formed in a direction different from that of each of the first and second stepped portions and the first stepped portion being connected to the second stepped portion through the third stepped portion, and so that each of the first and second stepped portions is directly connected to the third stepped portion; wherein the groove formed in the at least one of the first and second main surfaces of each of the first and second quartz crystal tuning fork tines has a fourth stepped portion opposite a fifth stepped portion in the length direction, the fourth stepped portion being directly connected to the first stepped portion and the fifth stepped portion being directly connected to the second stepped portion; and wherein the determining step comprises the step of determining each of the overall length of the quartz crystal tuning fork resonator and the length of the groove formed in the at least one of the first and second main surfaces of each of the first and second quartz crystal tuning fork tines so that the series resistance $R_1$ of the fundamental mode of vibration of the quartz crystal tuning fork resonator is less than the series resistance $R_2$ of the second overtone mode of vibration thereof or less than the series resistance $R_3$ of the third overtone mode of vibration thereof.*

*46. A method according to claim 37; wherein the quartz crystal tuning fork tines comprise first and second quartz crystal tuning fork tines connected to the quartz crystal tuning fork base, each of the first and second quartz crystal tuning fork tines having a length, a first main surface and a second main surface opposite the first main surface, and a first side surface and a second side surface opposite the first side surface; wherein the forming step of the at least one groove comprises the steps of forming a groove having at least two stepped portions including first and second stepped portions in the first main surface of the first quartz crystal tuning fork tine so that each of the first and second stepped portions is formed along the length of the first quartz crystal tuning fork tine and is formed directly opposite the first side surface of the first quartz crystal tuning fork tine, the first stepped portion being connected to the second stepped portion through a third stepped portion formed in a direction different from that of each of the first and second stepped portions, and so that each of the first and second stepped portions is directly connected to the third stepped portion, and forming a groove having at least three stepped portions including first, second and third stepped portions in the second main surface of the first quartz crystal tuning fork tine so that each of the first, second and third stepped portions is formed along the length of the first quartz crystal tuning fork tine and the first stepped portion is connected to the second stepped portion through a fourth stepped portion; wherein the groove formed in the first main surface of the first quartz crystal tuning fork tine has a first width and a second width greater than the first width; wherein a first distance in the width direction of the groove measured from a first outer edge of the first stepped portion of the groove to a first outer edge of the first side surface of the first quartz crystal tuning fork tine is greater than a second distance in the width direction of the groove measured from a second outer edge of the second stepped portion of the groove to a second outer edge of the first side surface of the first quartz crystal tuning fork tine; and wherein the first width of the groove formed in the first main surface of the first quartz crystal tuning fork tine is greater than the first distance and the second width of the groove formed in the first main surface of the first quartz crystal tuning fork tine is greater than the second distance.*

*47. A method according to claim 44; wherein the first side surface of the second quartz crystal tuning fork tine confronts the first side surface of the first quartz crystal tuning fork tine; wherein the forming step of the at least one groove comprises the steps of forming a groove having at least two stepped portions including first and second stepped portions in the first main surface of the second quartz crystal tuning fork tine so that each of the first and second stepped portions is formed along the length of the second quartz crystal tuning fork tine and the first stepped portion is connected to the second stepped portion through a third stepped portion formed in a direction different from that of each of the first and second*

*stepped portions, and so that each of the first and second stepped portions is directly connected to the third stepped portion, and forming a groove having at least three stepped portions including first, second and third stepped portions in the second main surface of the second quartz crystal tuning fork tine so that each of the first, second and third stepped portions is formed along the length of the second quartz crystal tuning fork tine and the first stepped portion is connected to the second stepped portion through a fourth stepped portion; wherein the groove formed in the first main surface of the second quartz crystal tuning fork tine has a first width and a second width greater than the first width; wherein a first distance in the width direction of the groove measured from a first outer edge of the first stepped portion of the groove to a first outer edge of the first side surface of the second quartz crystal tuning fork tine is greater than a second distance in the width direction of the groove measured from a second outer edge of the second stepped portion of the groove to a second outer edge of the first side surface of the second quartz crystal tuning fork tine; and wherein the first width of the groove formed in the first main surface of the second quartz crystal tuning fork tine is greater than the first distance and the second width of the groove formed in the first main surface of the second quartz crystal tuning fork tine is greater than the second distance.*

*48. A method according to claim 45; wherein the case has a through-hole and a mounting portion in the interior space; wherein the mounting step comprises the step of mounting the quartz crystal tuning fork resonator on the mounting portion in the interior space of the case; and further comprising the sequential steps of forming a quartz crystal tuning fork shape having the quartz crystal tuning fork base, and the first and second quartz crystal tuning fork tines; forming each of the groove having the first and second widths and the first and second distances in the first main surface of each of the first and second quartz crystal tuning fork tines so that the first width is greater than the first distance and the second width is greater than the second distance, and the groove having the first, second and third stepped portions in the second main surface of each of the first and second quartz crystal tuning fork tines so that each of the first, second and third stepped portions is formed along the length of the corresponding one of the first and second quartz crystal tuning fork tines; forming a first electrode on a surface of each of the first and second stepped portions of the groove formed in the second main surface of each of the first and second quartz crystal tuning fork tines and a second electrode on each of the first and second side surfaces of each of the first and second quartz crystal tuning fork tines so that the first electrode formed on the surface of each of the first and second stepped portions of the groove formed in the second main surface of the first quartz crystal tuning fork tine is connected to the second electrode formed on each of the first and second side surfaces of the second quartz crystal tuning fork tine, and the first electrode formed on the surface of each of the first and second stepped portions of the groove formed in the second main surface of the second quartz crystal tuning fork tine is connected to the second electrode formed on each of the first and second side surfaces of the first quartz crystal tuning fork tine; adjusting the frequency of oscillation of the quartz crystal tuning fork resonator to about 32.768 kHz with a frequency deviation within a range of −9000 ppm to +5000 ppm; mounting the quartz crystal tuning fork resonator on the mounting portion in the interior space of the case; adjusting the frequency of oscillation of the quartz crystal tuning fork resonator to about 32.768 kHz with a frequency deviation within a range of −50 ppm to +50 ppm; connecting the lid to the case to cover the open end thereof; and disposing a metal or a glass into the through-hole of the case to close the through-hole thereof in a vacuum.*

*49. A method according to claim 45; wherein the case has a through-hole and a mounting portion in the interior space; wherein the mounting step comprises the step of mounting the quartz crystal tuning fork resonator on the mounting portion in the interior space of the case; and further comprising the sequential steps of forming a quartz crystal tuning fork shape having the quartz crystal tuning fork base, and the first and second quartz crystal tuning fork tines; forming each of the groove having the first and second widths and the first and second distances in the first main surface of each of the first and second quartz crystal tuning fork tines so that the first width is greater than the first distance and the second width is greater than the second distance, and the groove having the first, second and third stepped portions in the second main surface of each of the first and second quartz crystal tuning fork tines so that each of the first, second and third stepped portions is formed along the length of the corresponding one of the first and second quartz crystal tuning fork tines; forming a first electrode on a surface of each of the first and second stepped portions of the groove formed in the second main surface of each of the first and second quartz crystal tuning fork tines and a second electrode on each of the first and second side surfaces of each of the first and second quartz crystal tuning fork tines so that the first electrode formed on the surface of each of the first and second stepped portions of the groove formed in the second main surface of the first quartz crystal tuning fork tine is connected to the second electrode formed on each of the first and second side surfaces of the second quartz crystal tuning fork tine, and the first electrode formed on the surface of each of the first and second stepped portions of the groove formed in the second main surface of the second quartz crystal tuning fork tine is connected to the second electrode formed on each of the first and second side surfaces of the first quartz crystal tuning fork tine; adjusting the frequency of oscillation of the quartz crystal tuning fork resonator to about 32.768 kHz with a frequency deviation within a range of −9000 ppm to +5000 ppm; mounting the quartz crystal tuning fork resonator on the mounting portion in the interior space of the case; connecting the lid to the case to cover the open end thereof; disposing a metal or a glass into the through-hole of the case to close the through-hole thereof in a vacuum; and adjusting the frequency of oscillation of the quartz crystal tuning fork resonator to about 32.768 kHz with a frequency deviation within a range of −30 ppm to +30 ppm.*

*50. A method according to claim 37; wherein the quartz crystal tuning fork tines comprise first and second quartz crystal tuning fork tines connected to the quartz crystal tuning fork base, each of the first and second quartz crystal tuning fork tines having a first main surface and a second main surface opposite the first main surface, and a first side surface and a second side surface opposite the first side surface, the first side surface of the first quartz crystal tuning fork tine confronting the first side surface of the second quartz crystal tuning fork tine; and wherein the forming step of the at least one groove comprises the step of forming a groove having a first width and a second width greater than the first width, and first, second and third surfaces in at least one of the first and second main surfaces of the first quartz crystal tuning fork tine so that the first surface is connected to the second surface through the third surface, and each of the first and second surfaces is directly opposite the first side surface of the first quartz crystal tuning fork tine and directly connected to the third surface, a distance in the width direction of*

*the groove measured from a first outer edge of the first surface of the groove to a first outer edge of the first side surface of the first quartz crystal tuning fork tine being defined by a first distance and a distance in the width direction of the groove measured from a second outer edge of the second surface of the groove to a second outer edge of the first side surface of the first quartz crystal tuning fork tine being defined by a second distance, the first distance being greater than the second distance, and so that the first width of the groove formed in the at least one of the first and second main surfaces of the first quartz crystal tuning fork tine is greater than the first distance and the second width of the groove formed in the at least one of the first and second main surfaces of the first quartz crystal tuning fork tine is greater than the second distance.*

*51. A method according to claim 48; wherein the forming step of the at least one groove comprises the step of forming a groove having a first width and a second width greater than the first width, and first, second and third surfaces in at least one of the first and second main surfaces of the second quartz crystal tuning fork tine so that the first surface is connected to the second surface through the third surface, and each of the first and second surfaces is directly opposite the first side surface of the second quartz crystal tuning fork tine and directly connected to the third surface, a distance in the width direction of the groove measured from a first outer edge of the first surface of the groove to a first outer edge of the first side surface of the second quartz crystal tuning fork tine being defined by a third distance and a distance in the width direction of the groove measured from a second outer edge of the second surface of the groove to a second outer edge of the first side surface of the second quartz crystal tuning fork tine being defined by a fourth distance, the third distance being greater than the fourth distance, and so that the first width of the groove formed in the at least one of the first and second main surfaces of the second quartz crystal tuning fork tine is greater than the third distance and the second width of the groove formed in the at least one of the first and second main surfaces of the second quartz crystal tuning fork tine is greater than the fourth distance.*

*52. A method according to claim 48; wherein the case has a mounting portion in the interior space; wherein the mounting step comprises the step of mounting the quartz crystal tuning fork resonator on the mounting portion in the interior space of the case; and further comprising the sequential steps of forming a quartz crystal tuning fork shape having the quartz crystal tuning fork base, and the first and second quartz crystal tuning fork tines; forming the groove having the first and second widths, and the first, second and third surfaces in the at least one of the first and second main surfaces of the first quartz crystal tuning fork tine so that each of the first and second surfaces is directly opposite the first side surface of the first quartz crystal tuning fork tine and directly connected to the third surface, and each of the first and second widths of the groove formed in the at least one of the first and second main surfaces of the first quartz crystal tuning fork tine is greater than each of the first distance and the second distance; forming a first electrode on each of the first and second surfaces of the groove formed in the at least one of the first and second main surfaces of the first quartz crystal tuning fork tine and a second electrode on each of the first and second side surfaces of the first quartz crystal tuning fork tine so that the first electrode formed on each of the first and second surfaces of the groove formed in the at least one of the first and second main surfaces of the first quartz crystal tuning fork tine has an electrical polarity opposite to an electrical polarity of the second electrode formed on each of the first and second side surfaces of the first quartz crystal tuning fork tine; adjusting the frequency of oscillation of the quartz crystal tuning fork resonator to a first preselected frequency of oscillation; mounting the quartz crystal tuning fork resonator on the mounting portion in the interior space of the case; and adjusting the frequency of oscillation of the quartz crystal tuning fork resonator to a second preselected frequency of oscillation.*

*53. A method according to claim 50; wherein the first preselected frequency of oscillation is about 32.768 kHz with a frequency deviation within a range of −9000 ppm to +5000 ppm; and wherein the second preselected frequency of oscillation is about 32.768 kHz with a frequency deviation within a range of −100 ppm to +100 ppm.*

*54. A method according to claim 50; wherein the second preselected frequency of oscillation is about 32.768 kHz with a frequency deviation within a range of −100 ppm to +100 ppm; and further comprising the step of connecting the lid to the case to cover the open end thereof after the adjusting step of the second preselected frequency of oscillation.*

*55. A method according to claim 37; wherein the quartz crystal tuning fork tines comprise first and second quartz crystal tuning fork tines connected to the quartz crystal tuning fork base, each of the first and second quartz crystal tuning fork tines having a first main surface and a second main surface opposite the first main surface, and an inner side surface and an outer side surface opposite the inner side surface, the inner side surface of the first quartz crystal tuning fork tine confronting the inner side surface of the second quartz crystal tuning fork tine, the inner side surface of each of the first and second quartz crystal tuning fork tines having a first outer edge and a second outer edge; wherein the forming step of the at least one groove comprises the step of forming a groove having a length, and a first outer edge and a second outer edge in at least one of the first and second main surfaces of each of the first and second quartz crystal tuning fork tines so that a first distance in the width direction of the groove measured from the first outer edge of the groove to the first outer edge of the inner side surface of the first quartz crystal tuning fork tine is different from or greater than a second distance in the width direction of the groove measured from the second outer edge of the groove to the second outer edge of the inner side surface of the first quartz crystal tuning fork tine, and so that a third distance in the width direction of the groove measured from the first outer edge of the groove to the first outer edge of the inner side surface of the second quartz crystal tuning fork tine is different from or greater than a fourth distance in the width direction of the groove measured from the second outer edge of the groove to the second outer edge of the inner side surface of the second quartz crystal tuning fork tine; and wherein the determining step comprises the step of determining the overall length of the quartz crystal tuning fork resonator and the length of the groove formed in the at least one of the first and second main surfaces of each of the first and second quartz crystal tuning fork tines so that the series resistance $R_1$ of the fundamental mode of vibration of the quartz crystal tuning fork resonator is less than the series resistance $R_2$ of the second overtone mode of vibration thereof or less than the series resistance $R_3$ of the third overtone mode of vibration thereof.*

*56. A method according to claim 37; wherein the quartz crystal tuning fork tines comprise first and second quartz crystal tuning fork tines connected to the quartz crystal tuning fork base, each of the first and second quartz crystal tuning fork tines having a first main surface and a second main surface opposite the first main surface, and an inner side surface and an outer side surface opposite the inner side*

*surface, the inner side surface of the first quartz crystal tuning fork tine confronting the inner side surface of the second quartz crystal tuning fork tine; wherein the forming step of the at least one groove comprises the step of forming a groove in at least one of the first and second main surfaces of each of the first and second quartz crystal tuning fork tines so that a width $W_2$ of the groove formed in the at least one of the first and second main surfaces of each of the first and second quartz crystal tuning fork tines is greater than distances in the width direction of the groove measured from a first outer edge of the groove to a first outer edge of the inner side surface of the corresponding one of the first and second quartz crystal tuning fork tines and measured from a second outer edge different from the first outer edge of the groove to a second outer edge different from the first outer edge of the inner side surface of the corresponding one of the first and second quartz crystal tuning fork tines, and the ratio ($W_2/W$) is within a range of 0.35 to 0.85, where W represents a width of each of the first and second quartz crystal tuning fork tines; wherein the groove formed in the at least one of the first and second main surfaces of each of the first and second quartz crystal tuning fork tines has a first groove portion including a first surface, a second groove portion including a second surface and a third groove portion including a third surface, the first surface being connected to the second surface through the third surface, and each of the first and second surfaces being opposite the inner side surface of the corresponding one of the first and second quartz crystal tuning fork tines and directly connected to the third surface not opposite the inner side surface; wherein a first distance in the width direction of the first groove portion of the groove measured from a first outer edge of the first surface of the first groove portion of the groove to a first outer edge of the inner side surface of the corresponding one of the first and second quartz crystal tuning fork tines is different from or greater than a second distance in the width direction of the second groove portion of the groove measured from a second outer edge of the second surface of the second groove portion of the groove to a second outer edge of the inner side surface of the corresponding one of the first and second quartz crystal tuning fork tines; and wherein the distances in the width direction of the groove comprises the first distance in the width direction of the first groove portion and the second distance in the width direction of the second groove portion.*

*57. A method according to claim 54; wherein the first groove portion of the groove formed in the at least one of the first and second main surfaces of each of the first and second quartz crystal tuning fork tines has a first width and the second groove portion of the groove formed in the at least one of the first and second main surfaces of each of the first and second quartz crystal tuning fork tines has a second width greater than the first width; and wherein the first width of the first groove portion of the groove formed in the at least one of the first and second main surfaces of each of the first and second quartz crystal tuning fork tines is greater than the first distance in the width direction of the first groove portion of the groove and the second width of the second groove portion of the groove formed in the at least one of the first and second main surfaces of each of the first and second quartz crystal tuning fork tines is greater than the second distance in the width direction of the second groove portion of the groove.*

*58. A method according to claim 37; wherein the quartz crystal tuning fork tines comprise the first and second quartz crystal tuning fork tines, each of the first and second quartz crystal tuning fork tines having a length, and a first main surface and a second main surface opposite the first main surface, and a first side surface and a second side surface opposite the first side surface, the first side surface of the first quartz crystal tuning fork tine confronting the first side surface of the second quartz crystal tuning fork tine; wherein the case has a through-hole and a mounting portion in the interior space; wherein the mounting step comprises the step of mounting the quartz crystal tuning fork resonator on the mounting portion in the interior space of the case; wherein the forming step of the at least one groove comprises the steps of forming a groove having at least two stepped portions including first and second stepped portions in the first main surface of at least one of the first and second quartz crystal tuning fork tines so that each of the first and second stepped portions is formed along the length of the at least one of the first and second quartz crystal tuning fork tines and formed directly opposite the first side surface of the at least one of the first and second quartz crystal tuning fork tines, the first stepped portion being connected to the second stepped portion through a third stepped portion formed in a direction different from that of each of the first and second stepped portions, and so that each of the first and second stepped portions is directly connected to the third stepped portion, the groove formed in the first main surface of the at least one of the first and second quartz crystal tuning fork tines having a first width and a second width greater than the first width, a first distance in the width direction of the groove measured from a first outer edge of the first stepped portion of the groove to a first outer edge of the first side surface of the at least one of the first and second quartz crystal tuning fork tines being greater than a second distance in the width direction of the groove measured from a second outer edge of the second stepped portion of the groove to a second outer edge of the first side surface of the at least one of the first and second quartz crystal tuning fork tines, and so that each of the first and second widths of the groove formed in the first main surface of the at least one of the first and second quartz crystal tuning fork tines is greater than each of the first distance and the second distance, and forming a groove having at least three stepped portion including first, second and third stepped portions in the second main surface of the at least one of the first and second quartz crystal tuning fork tines so that each of the first, second and third stepped portions is formed along the length of the corresponding one of the first and second quartz crystal tuning fork tines; wherein the adjusting step comprises the steps of adjusting the frequency of oscillation of the quartz crystal tuning fork resonator to about 32.768 kHz with a frequency deviation within a range of −9000 ppm to +5000 ppm, and adjusting the frequency of oscillation of the quartz crystal tuning fork resonator to about 32.768 kHz with a frequency deviation within a range of −50 ppm to +50 ppm; and further comprising the steps of forming a quartz crystal tuning fork shape having the quartz crystal tuning fork base, and the first and second quartz crystal tuning fork tines; forming a metal film on a surface of the groove formed in each of the first and second main surfaces of the at least one of the first and second quartz crystal tuning fork tines and a second electrode on each of the first and second side surfaces of the at least one of the first and second quartz crystal tuning fork tines; forming a first electrode on the surface of the groove formed in each of the first and second main surfaces of the at least one of the first and second quartz crystal tuning fork tines and a second electrode on each of the first and second side surfaces of the at least one of the first and second quartz crystal tuning fork tines so that the first electrode formed on the surface of the groove formed in each of the first and second main surfaces of the at least one of the first and second quartz crystal tuning fork tines has an electrical polarity opposite to an electrical polarity of the second elec-*

*trode formed on the each of the first and second side surfaces of the at least one of the first and second quartz crystal tuning fork tines; and disposing a metal or a glass into the through-hole of the case to close the through-hole thereof in a vacuum.*

*59. A method according to claim 37; wherein the quartz crystal tuning fork tines comprise first and second quartz crystal tuning fork tines connected to the quartz crystal tuning fork base, each of the first and second quartz crystal tuning fork tines having a length, and a first main surface and a second main surface opposite the first main surface, and a first side surface and a second side surface opposite the first side surface, the first side surface of the first quartz crystal tuning fork tine confronting the first side surface of the second quartz crystal tuning fork tine; wherein the forming step of the at least one groove comprises the step of forming a groove in at least one of the first and second main surfaces of at least one of the first and second quartz crystal tuning fork tines so that the groove comprises a first groove portion having a first width and a first surface, a second groove portion having a second width greater than the first width and a second surface, and a third groove portion having a third surface and each of the first and second surfaces is formed along the length of the at least one of the first and second quartz crystal tuning fork tines, the third surface being formed in a direction different from each of the first and second surfaces and the first surface being connected to the second surface through the third surface, and so that each of the first and second surfaces is directly opposite the first side surface of the at least one of the first and second quartz crystal tuning fork tines and directly connected to the third surface; wherein a first distance in the width direction of the first groove portion of the groove measured from a first outer edge of the first surface of the first groove portion of the groove to a first outer edge of the first side surface of the at least one of the first and second quartz crystal tuning fork tines is greater than a second distance in the width direction of the second groove portion of the groove measured from a second outer edge of the second surface of the second groove portion of the groove to a second outer edge of the first side surface of the at least one of the first and second quartz crystal tuning fork tines; and wherein the first width of the first groove portion of the groove formed in the at least one of the first and second main surfaces of the at least one of the first and second quartz crystal tuning fork tines is greater than the first distance in the width direction of the first groove portion of the groove and the second width of the second groove portion of the groove formed in the at least one of the first and second main surfaces of the at least one of the first and second quartz crystal tuning fork tines is greater than the second distance in the width direction of the second groove portion of the groove.*

* * * * *